US012810111B2

(12) United States Patent
Haase et al.

(10) Patent No.: US 12,810,111 B2
(45) Date of Patent: Nov. 24, 2026

(54) METHODS AND APPARATUSES FOR COMPRESSING PARAMETERS OF NEURAL NETWORKS

(71) Applicant: Fraunhofer-Gesellschaft zur Foerderung der angewandten Forschung e.V., Munich (DE)

(72) Inventors: Paul Haase, Berlin (DE); Arturo Marban Gonzalez, Berlin (DE); Heiner Kirchhoffer, Berlin (DE); Talmaj Marinc, Berlin (DE); Detlev Marpe, Berlin (DE); Stefan Matlage, Berlin (DE); David Neumann, Berlin (DE); Hoang Tung Nguyen, Berlin (DE); Wojciech Samek, Berlin (DE); Thomas Schierl, Berlin (DE); Heiko Schwarz, Berlin (DE); Simon Wiedemann, Berlin (DE); Thomas Wiegand, Berlin (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 19/210,307

(22) Filed: May 16, 2025

(65) Prior Publication Data

US 2025/0278599 A1 Sep. 4, 2025

Related U.S. Application Data

(60) Division of application No. 17/478,676, filed on Sep. 17, 2021, which is a continuation of application No. PCT/EP2020/057513, filed on Mar. 18, 2020.

(30) Foreign Application Priority Data

Mar. 18, 2019 (EP) .................................... 19163546

(51) Int. Cl.
*G06N 3/04* (2023.01)
*G06N 3/10* (2006.01)
*H03M 7/30* (2006.01)

(52) U.S. Cl.
CPC ................. *G06N 3/04* (2013.01); *G06N 3/10* (2013.01); *H03M 7/702* (2013.01)

(58) Field of Classification Search
None
See application file for complete search history.

(56) References Cited

U.S. PATENT DOCUMENTS 8,730,070 B2 5/2014 Wang et al.
2016/0219276 A1 7/2016 Li et al.
(Continued)

FOREIGN PATENT DOCUMENTS

CA 3066204 A1 1/2019
CN 103733622 A 4/2014
(Continued)

OTHER PUBLICATIONS

"Guide to Huffman Coding," Stanford University, Zelenski et al; Zelenski (Year: 2023).*
(Continued)

*Primary Examiner* — Michael J Huntley
*Assistant Examiner* — Paul J Breene
(74) *Attorney, Agent, or Firm* — ASHURST PERKINS COIE US LLP; Michael A. Glenn

(57) ABSTRACT

An encoder for encoding weight parameters of a neural network is configured to obtain a plurality of weight parameters of the neural network, to encode the weight parameters of the neural network using a context-dependent arithmetic coding, to select a context for an encoding of a weight parameter, or for an encoding of a syntax element of a number representation of the weight parameter, in depen-
(Continued)

dence on one or more previously encoded weight parameters and/or in dependence on one or more previously encoded syntax elements of a number representation of one or more weight parameters, and to encode the weight parameter, or a syntax element of the weight parameter, using the selected context. Corresponding decoder, quantizer, methods and computer programs are also described.

17 Claims, 4 Drawing Sheets

(56) References Cited

U.S. PATENT DOCUMENTS

| | | | | |
|---|---|---|---|---|
| 2018/0082181 | A1* | 3/2018 | Brothers | G06N 3/045 |
| 2018/0089564 | A1 | 3/2018 | Tate et al. | |
| 2018/0089587 | A1 | 3/2018 | Suresh et al. | |
| 2018/0184123 | A1 | 6/2018 | Terada et al. | |
| 2018/0227580 | A1 | 8/2018 | Li et al. | |

FOREIGN PATENT DOCUMENTS

| | | | |
|---|---|---|---|
| CN | 107871160 | A | 4/2018 |
| JP | 2018506912 | A | 3/2018 |
| KR | 20170108011 | A | 9/2017 |
| KR | 20180018544 | A | 2/2018 |
| WO | 2012172114 | A1 | 12/2012 |
| WO | 2016199330 | A1 | 12/2016 |
| WO | 2018057302 | A1 | 3/2018 |

OTHER PUBLICATIONS

"Entropy Coding in HEVC," Springer-Verlag: MIT Libraries, Marpe et al.; Marpe (Year: 2014).*
Song, R., et al., "Neural Network-Based Arithmetic Coding of Intra Prediction Modes in HEVC," CAS Key Laboratory of Technology in Geo-Spatial Information Processing and Application System, University of Science and Techology of China (Year 2017)—4 pages.
"ITU-T H.265 High efficiency video coding", ITU—International Telecommunication Union, Series H: Audiovisual and multimedia systems—Infrastructure of audiovisual services—Coding of moving video, Apr. 2015, Apr. 2015, 244 pp.
Anonymous, "Context-adaptive binary arithmetic coding", Nov. 14, 2018 (Nov. 14, 2018), Retrieved from the Internet: URL:https://en.wikipedia.org/w/index.php?title=Context-adaptive_binary_arithmetic_coding&oldid=868799469, XP002795705, Nov. 14, 2018, 4 pp.
Anonymous, "Reference arithmetic coding", Jun. 28, 2018 (Jun. 28, 2018), Retrieved from the Internet: URL:https://www.nayuki.io/page/reference-arithmetic-coding, XP055699170, Jun. 28, 2018, 4 pp.
Anwar, Sajid, "Structured pruning of deep convolutional neural networks", ACM Journal on Emerging Technologies in Computing Systems, vol. 13, No. 3, Article 32, Publication date: Feb. 2017, Feb. 2017, 18 pp.
Bach, Sebastian, "On pixel-wise explanations for non-linear classifier decisions by layer-wise relevance propagation", PLOS ONE, 10(7):e0130140, 2015, Jul. 10, 2015, 46 pp.
Basu, Sourya, "Succinct Source Coding of Deep Neural Networks", Apr. 8, 2018 (Apr. 8, 2018), Retrieved from the Internet: URL:https://openreview.net/pdf?id=HJgPAWD-iX, XP055699240, Apr. 8, 2018, 4 pp.
Basu, Sourya, "Universal and Succinct Source Coding of Deep Neural Networks", arxiv.org, Cornell University Library, 201 Olin Library Cornell University Ithaca, NY 14853,Apr. 9, 2018 (Apr. 9, 2018), XP080868735, Apr. 9, 2018, 18 pp.
Bross, Benjamin, "JVET-M1001-v6—Versatile Video Coding (Draft 4)", Joint Video Experts Team (JVET) of ITU-T SG 16 WP 3 and ISO/IEC JTC 1/SC 29/WG 11, 13th Meeting: Marrakech, MA, Jan. 9-18, 2019, Jan. 2019, 294 pp.
Chetlur, Sharan, "cuDNN: Efficient Primitives for Deep Learning", arXiv: 1410.0759, 2014, Dec. 18, 2014, 9 pp.
Choi, Yoojin, "Towards the limit of network quantization", arXiv:1612.01543, 2016, Dec. 5, 2016, 20 pp.
Cun, Yann Le, "Optimal brain damage", Advances in neural information processing systems, 1990, 1990, 8 pp.
Han, Song, "Learning both Weights and Connections for Efficient Neural Networks", arXiv: 1506.02626, 2015, Oct. 30, 2015, 9 pp.
Hassibi, Babak, "Second order derivatives for network pruning: Optimal brain surgeon", Advances in neural information processing systems, 1993, 1993, 8 pp.
He, Yihui, "Channel pruning for accelerating very deep neural networks", Proceedings of the IEEE International Conference on Computer Vision, 2017, 2017, 9 pp.
Hu, Hengyuan, "Network trimming: A datadriven neuron pruning approach towards efficient deep architectures", arXiv:1607.03250, 2016, Jul. 12, 2016, 9 pp.
Kingma, Diederik P, "Dropout and the Local Reparameterization Trick", arXiv: 1506.02557, 2015, Dec. 20, 2015, 14 pp.
Kirchhoffer, Heiner, "JVET-K0430-v3—CE5-related: State-based probability estimator", Joint Video Experts Team (JVET) of ITU-T SG 16 WP 3 and ISO/IEC JTC 1/SC 29/WG 11, 11th Meeting: Ljubljana, SI, Jul. 10-18, 2018, Jul. 2018, 6 pp.
Li, Hao, "Pruning filters for efficient convnets", arXiv:1608.08710, 2016, Sep. 15, 2016, 9 pp.
Louizos, Christos, "Bayesian Compression for Deep Learning", arXiv:1705.08665, 2017, Nov. 6, 2017, 17 pp.
Marpe, Detlev, "Context-Based Adaptive Binary Arithmetic Coding in the H.264/AVC Video Compression Standard", IEEE transactions on circuits and systems for video technology, vol. 13, No. 7, pp. 620-636, Jul. 2003, Jul. 2003, pp. 620-636.
Molchanov, Dmitry, "Variational Dropout Sparsifies Deep Neural Networks", arXiv:1701.05369, 2017, Jun. 13, 2017, 10 PP.
Molchanov, Pavlo, "Pruning convolutional neural networks for resource efficient inference", arXiv:1611.06440, Published as a conference paper at ICLR 2017, 17 pp., 2017.
Park, Eunhyeok, "Weighted-entropy-based quantization for deep neural networks", CVPR, 2017, 2017, 9 pp.
Reagen, Brandon, "Weightless: Lossy Weight Encoding For Deep Neural Network Compression", Jan. 1, 2018 (Jan. 1, 2018), Retrieved from the Internet: URL:http://proceedings.mlr.press/v80/reagan18a/reagan18a.pdf, XP055629907, Jan. 1, 2018, 10 pp.
Wiegand, Thomas, "Source coding: Part I of fundamentals of source and video coding", Foundations and Trends® in Signal Processing: vol. 4: No. 1-2, 2011, 2011, 190 pp.
Yu, Ruichi, "Nisp: Pruning networks using neuron importance score propagation", Proceedings of the IEEE Conference on Computer Vision and Pattern Recognition, 2018, Mar. 21, 2018, 15 pp.
"Golomb Coding", Wikipedia, 6 Pages, (Year: 2017).
"Exponential-Golomb coding", Wikipedia (Year: 2019).
"Golomb coding", Wikipedia (Year: 2018).
Lee, Szu-Wei, "Complexity modeling for context-based adaptive binary arithmetic coding (CABAC) in H.264/AVC decoder", Ming Hsieh Department of Electrical Engineering and Signal and Image Processing Institute, University of Southern California, Lee et al.; Year: 2007.

* cited by examiner

METHODS AND APPARATUSES FOR COMPRESSING PARAMETERS OF NEURAL NETWORKS

CROSS-REFERENCES TO RELATED APPLICATIONS

This application is a divisional of U.S. patent application Ser. No. 17/478,676 filed Sep. 17, 2021, which is a continuation of International Application No. PCT/EP2020/057513, filed Mar. 18, 2020, which is incorporated herein by reference in its entirety, and additionally claims priority from European Application No. EP 19163546.5, filed Mar. 18, 2019, which is incorporated herein by reference in its entirety.

Embodiments according to an aspect of the present invention are related to encoders for encoding weight parameters of a neural network.

Further embodiments according to an aspect of the present invention are related to decoders for decoding weight parameters of a neural network.

Further embodiments according to an aspect of the present invention are related to quantizers for quantizing weight parameters of a neural network.

Further embodiments according to an aspect of the present invention are related to respective methods and computer programs.

Embodiments according to an aspect of the present invention are related to apparatuses which quantize and convert neural networks into a bitstream, resulting in a compressed representation of them.

Further embodiments will be defined by the enclosed claims.

It should be noted that any embodiments as defined by the claims can be supplemented by any of the details (features and functionalities) described herein.

Also, the embodiments described herein can be used individually, and can also be supplemented by any of the features included in the claims.

Also, it should be noted that individual aspects described herein can be used individually or in combination. Thus, details can be added to each of said individual aspects without adding details to another one of said aspects.

It should also be noted that the present disclosure describes, explicitly or implicitly, features usable in a video encoder (apparatus for providing an encoded representation of an input video signal) and in a video decoder (apparatus for providing a decoded representation of a video signal on the basis of an encoded representation). Thus, any of the features described herein can be used in the context of a video encoder and in the context of a video decoder.

Moreover, features and functionalities disclosed herein relating to a method can also be used in an apparatus (configured to perform such functionality). Furthermore, any features and functionalities disclosed herein with respect to an apparatus can also be used in a corresponding method. In other words, the methods disclosed herein can be supplemented by any of the features and functionalities described with respect to the apparatuses.

Also, any of the features and functionalities described herein can be implemented in hardware or in software, or using a combination of hardware and software, as will be described in the section "implementation alternatives".

Moreover, any of the features and syntax elements described herein can optionally be introduced into a video bit stream, both individually and taken in combination.

BACKGROUND OF THE INVENTION

This document describes an apparatus which quantizes and converts neural networks into a bitstream, resulting in a compressed representation of them.

The methodology of the apparatus may be divided into different main parts, which consist of the following:

1. Relevance estimation
2. Quantization
3. Lossless encoding
4. Lossless decoding Before we dive into the methodology of the apparatus, we firstly will give a brief introduction on the topic of neural networks.

Neural networks: In their most basic form, neural networks constitute a chain of affine transformations followed by an element-wise non-linear function. They may be represented as a directed acyclic graph, as depicted in the image below. Each node entails a particular value, which is forward propagated into the next node by multiplication with the respective weight value of the edge. All incoming values are then simply aggregated.

FIG. 1 shows an example for a graph representation of a feed forward neural network. Specifically, this 2-layered neural network is a non-linear function which maps a 4-dimensional input vector into the real line.

Mathematically, the neural network of FIG. 1 would calculate the output in the following manner:

$$\text{output} = \sigma(W_2 \cdot \sigma(W_1 \cdot \text{input}))$$

where W2 and W1 are the neural networks weight parameters (edge weights) and sigma is some non-linear function. For instance, so-called convolutional layers may also be used by casting them as matrix-matrix products as described in "cuDNN: Efficient Primitives for Deep Learning" (Sharan Chetlur, et al.; arXiv: 1410.0759, 2014). From now on, we will refer as inference the procedure of calculating the output from a given input. Also, we will call intermediate results as hidden layers or hidden activation values, which constitute a linear transformation+element-wise non-linearity, e.g. such as the calculation of the first dot product+non-linearity above.

Usually, neural networks are equipped with millions of parameters, and may thus involve hundreds of MB in order to be represented. Consequently, they involve high computational resources in order to be executed since their inference procedure involves computations of many dot product operations between large matrices. Hence, it is of high importance to reduce the complexity of performing these dot products.

Relevance estimation: One way to reduce the complexity of inference of neural networks is to quantize the weight parameters. As a direct consequence of quantization is a reduction of memory complexity, however, as we will see later, quantization may also allow to reduce the runtime of performing inference.

In order to quantize the weight parameters in the most efficient manner, we need to be able to distinguish between "more or less relevant" parts of the network. That is, we need a measure of the "importance" of each parameter (or set of parameters) in order to know how much one may perturb those while minimally affecting the prediction accuracy of the network.

In the following, an introduction into some conventional solutions will be provided.

There are several relevance estimation methods proposed in the literature. Some have proposed measures based on a Taylor expansion of the network. For example in "Second order derivatives for network pruning: Optimal brain surgeon" (Babak Hassibi et al, in Advances in neural information processing systems, 1993), "Optimal brain damage" (Yann LeCun, et al. in Advances in neural information processing systems, 1990) and "Pruning convolutional neural networks for resource efficient inference" (Pavlo Molchanov, et al.; arXiv: 1611.06440, 2016).

In other works, some proposed measures are based on the magnitude of the parameters. For example in "Channel pruning for accelerating very deep neural networks" (Yihui He, et al. in Proceedings of the IEEE International Conference on Computer Vision, 2017), "Pruning filters for efficient convnets" (Hao Li, et al.; arXiv: 1608.08710, 2016) and "Learning both Weights and Connections for Efficient Neural Networks" (Song Han, et al.; arXiv: 1506.02626, 2015).

Again other measures are proposed, such as count of zero activations in "Network trimming: A data-driven neuron pruning approach towards efficient deep architectures" (Hengyuan Hu, et al.; arXiv: 1607.03250, 2016), particle filtering techniques in "Structured pruning of deep convolutional neural networks"/Sajid Anwar, et al., in ACM Journal on Emerging Technologies in Computing Systems (JETC), 2017), custom measures like the Neuron Importance Score Propagation (NISP) in "Nisp: Pruning networks using neuron importance score propagation" (Ruichi Yu, et al., in Proceedings of the IEEE Conference on Computer Vision and Pattern Recognition, 2018) or the Layer Relevance Propagation method in "On pixel-wise explanations for non-linear classifier decisions by layer-wise relevance propagation" (Sebastian Bach, et al., PLOS ONE, 10(7): e0130140, 2015).

As a parallel line of work, the literature has investigated and applied scalable Bayesian methods on to neural networks. For example, in "Variational Dropout and the Local Reparameterization Trick" (Diederik P. Kingma, et al.; arXiv: 1506.02557, 2015), "Variational Dropout Sparsifies Deep Neural Networks" (Dmitry Molchanov, et al.; arXiv: 1701.05369, 2017) and "Bayesian Compression for Deep Learning" (Christos Louizos, et al.; arXiv: 1705.08665, 2017).

The goal here is not to only learn a single neural network that performs well on the task, but an entire distribution of these. Thus, as a result, the learning algorithm will output the sufficient statistics of each weight parameter, such as mean and variance. As a direct consequence, one may derive the "relevance" of each weight parameter directly from the second order statistics of the weight parameters, thus, from their variances. In other words, the higher the variance of a parameter is the less relevant that value is, since we may greatly perturb that parameter from its mean value without affecting the networks output decision.

In view of this situation, there is a desire for a concept which provides for an improved compromise between compression of a neural network into a compressed representation of it and the prediction accuracy of the network, which is affected detrimental when compressed to eagerly.

SUMMARY

An embodiment may have a decoder for decoding weight parameters of a neural network, wherein the decoder is configured to obtain a plurality bits representing weight parameters of the neural network; wherein the decoder is configured to decode the weight parameters of the neural network using a context-dependent arithmetic coding; wherein the decoder is configured to select a context for a decoding of a weight parameter, or for a decoding of a syntax element of a number representation of the weight parameter, in dependence on one or more previously decoded weight parameters and/or in dependence on one or more previously decoded syntax elements of a number representation of one or more weight parameters; and wherein the decoder is configured to decode the weight parameter, or a syntax element of the weight parameter, using the selected context.

According to another embodiment, a method for decoding weight parameters of a neural network may have the steps of: obtaining a plurality of bits representing weight parameters of the neural network; decoding the weight parameters of the neural network using a context-dependent arithmetic coding; selecting a context for a decoding of a weight parameter, or for a decoding of a syntax element of a number representation of the weight parameter, in dependence on one or more previously decoded weight parameters and/or in dependence on one or more previously decoded syntax elements of a number representation of one or more weight parameters; and in which method the weight parameter, or a syntax element of the weight parameter, is decoded using the selected context.

According to yet another embodiment, a non-transitory digital storage medium may have a computer program stored thereon to perform the inventive method, when said computer program is run by a computer.

An aspect of the present invention is an encoder for encoding weight parameters of a neural network. The encoder obtains a plurality of weight parameters of the neural network, and encodes the weight parameters using a context-dependent arithmetic coding. In that the encoder selects a context for encoding a weight parameter or a syntax element of a number representation of the weight parameter. The selection is performed in dependence on one or more previously encoded weight parameters and/or syntax elements of a number representation of one or more weight parameters. Then the encoder encodes the weight parameter or syntax element of the weight parameter, using the selected context.

The weight parameters can e.g. be $w_i$ or $q_i$ or $l_i$, and the neural network can for example be a quantized version of a neural network. The context-dependent arithmetic coding can for example be a context-adaptive binary arithmetic coding, CABAC, wherein, also as an example, probabilities of bin values are determined for different contexts, and wherein, for example, each bin is associated with a context.

The encoder selects a context, e.g. a context having a context index C, for the encoding, which can be an arithmetic encoding, of the weight parameter, e.g. $w_i$. Alternatively, a syntax element, e.g. a zero flag "sig_flag" or a sign flag "sign_flag", can be encoded, possibly arithmetically. The syntax element can also be an encoded representation of an absolute value of the weight parameter or an encoded representation of most significant part of the absolute value of the weight parameter, which can for example be a unary sequence of bins, or a truncated unary sequence of bins. Further, the syntax elements can also be an encoded representation of a least significant part of the absolute value of the weight parameter, e.g. a fixed length sequence.

The syntax element refers to a number representation, e.g. a rounded or quantized number representation, of the weight parameter.

And the encoder selects the context in dependence on previously encoded weight parameters, e.g. $w_i$ and/or syntax elements of a number representation of one or more weight parameters.

It has been found that encoding with a context depending on previously encoded weight parameters or syntax elements is beneficial for the compression of a neural network.

In an advantageous embodiment, the encoder determines probabilities for bin values of a given bin associated with a given context in dependence on one or more previously encoded bin values associated with the given context.

Therein a bin can e.g. be representing a zero flag or a sign flag of the weight parameter, or a bit of an absolute value representation of the weight parameter. Bin values can for example be binary, i.e. 0 and 1. Each bin is associated with a context, but can also be associated with more than one context.

The encoded bin values associated with the context or contexts can for example refer to values of bin, which can represent a zero flag, a sign flag, or one or more bits of absolute value representations of previously encoded weight parameters.

It has been found that the probabilities of these elements can be determined from the previously encoded weight parameters.

In another advantageous embodiments the encoder selects the context for encoding of the zero flag of the weight parameter in one of the following manners, wherein the weight parameter refers to the currently encoded weight parameter.

The selection can be performed in dependence on a sign of a previously encoded weight parameter.

The selection can be performed out of at least three different zero flag contexts. The selection chooses one of the three contexts in dependence whether the previously encoded weight parameter is equal to zero, smaller than zero, or larger than zero.

The selection can be performed in dependence on whether a currently encoded weight parameter is a first weight parameter in a scanning row or a scanning column of a matrix of weight parameters.

An example for this is whether an x-index of a currently encoded weight parameter takes a lowest possible value of, for example 0, for a scanning order from a smallest x-index towards larger x-indices.

Another example is whether an x-index of a currently encoded weight parameter takes a largest possible value for a scanning order from a largest x-index towards smaller x-indices.

A further example is whether a y-index of a currently encoded weight parameter takes a lowest possible value of, for example 0, for a scanning order from a smallest y-index towards larger y-indices.

Yet another example is whether a y-index of a currently encoded weight parameter takes a largest possible value for a scanning order from a largest y-index towards smaller y-indices.

Therein, for example, a predetermined context is selectively used in the currently encoded weight parameter is a first weight parameter in the scanning row or the scanning column of a matrix of weight parameters.

The selection can be performed in dependence on whether a weight parameter preceding the currently encoded weight parameter has already been encoded and/or is available.

In this case, preceding refers, for example, to a scan direction of a scanning row or a scanning column of a matrix of weight parameters.

The selection criteria can also be combined such that the selection is performed such that a first context is selected if a previously encoded weight parameter is zero and a weight parameter preceding the currently encoded weight parameter has not yet been encoded and is not available, while a second context is selected if the previously encoded weight parameter is smaller than zero, and a third context is selected if the previously encoded weight parameter is larger than zero.

In other words, the first context for encoding of a zero flag of the weight parameter, e.g. the currently encoded weight parameter, is selected in case that a previously encoded weight parameter is zero and in case that a weight parameter preceding the currently encoded weight parameter, for example, when considering a scan direction of a scanning row or a scanning column of a matrix of weight parameters, has not yet been encoded and in case that a weight parameter preceding the currently encoded weight parameter, for example, when considering a scan direction of a scanning row or a scanning column of a matrix of weight parameters, is not available, e.g. a position of the weight parameter preceding the currently encoded weight parameter, when considering the scan direction, is outside of the weight matrix.

The second context for an encoding of a zero flag of the weight parameter, e.g. the currently encoded weight parameter, in case that the previously encoded weight parameter, which is e.g. preceding the currently encoded weight parameter, is smaller than zero.

Finally, the third context for an encoding of a zero flag of the weight parameter, e.g. the currently encoded weight parameter, is selected in case that the previously encoded weight parameter, which again is e.g. preceding the currently encoded weight parameter, is larger than zero.

Again, the encoding can be arithmetical encoding, and the zero flag can e.g. be a syntax element "sig_flag".

It has been found that selecting the context for the zero flag according to above criteria can improve the compression.

In another advantageous embodiment, the encoder determines a plurality of status identifiers representing statuses of a plurality of weight parameters at a plurality of positions relative to a position of a currently encoded weight parameter in the form of a numeric value. The encoder then combines, e.g. linearly, the status identifiers, in order to obtain a context index value representing a context of the currently encoded weight parameter. The currently encoded weight parameter, can for example be a zero flag, e.g. a syntax element "sig_flag", of the currently encoded weight parameter. Therein, for example, each possible constellation or combination of status identifier values is mapped to a context value or even to a unique context value.

The status identifiers can e.g. be called $s_{x-1,y}$, $s_{x,y-1}$, $s_{x-1,y-1}$ and can represent statuses as for example an availability, an encoding status (i.e. already encoded or not), a zero-status (i.e. equal to zero or not), a sign, a magnitude (e.g. an absolute value), and so on.

An example for a combination is according to $C=s_{x-1,y}+3*s_{x,y-1}+9*s_{x-1,y-1}$. The obtained context index can then e.g. be C.

Advantageously therefor, the encoder selects a context, as detailed above, in dependence on how many zero-valued, e.g. previously encoded, weight parameters and/or unavailable weight parameters in a row are adjacent to the currently encoded weight parameter.

Unavailable weight parameters can e.g. be called $l_{x-1,y}$, $l_{x-2,y}$, $l_{x-3,y}$ and be represented by status identifiers $s_{x-1,y}$, $s_{x-2,y}$, $s_{x-3,y}$.

Further advantageously therefor, the plurality of weight parameters is arranged in a matrix, and the weight parameters are denoted as $l_{x-1,y}$, $l_{x-2,y}$ and $l_{x-3,y}$ and correspond to positions (x−1,y), (x−2,y) and (x−3,y) in the matrix, respectively, and are represented by status identifiers $s_{x-1,y}$, $s_{x-2,y}$, $s_{x-3,y}$.

It is further possible that the plurality of weight parameters is arranged in a matrix, and a status identifier $s_{x,y}$ for a position (x,y) in the matrix is equal to a first value, e.g. 0, if the position (x,y) is not available, e.g. is located outside of the matrix or has not yet been encoded, or the weight parameter at the position (x,y) is equal to zero, the status identifier $s_{x,y}$ for the position (x,y) is equal a second value, e.g. 1, if the weight parameter at the position (x,y) is smaller than zero, and the status identifier $s_{x,y}$ for the position (x,y) is equal to a third value, e.g. 2, if the weight parameter at the position (x,y) is larger than 0.

Alternatively, the plurality of weight parameters is arranged in a matrix, and a status identifier $s_{x,y}$ for a position (x,y) in the matrix is equal to a first value, e.g. 0, if the position (x,y) is not available, e.g. is located outside of the matrix or has not yet been encoded, or the weight parameter at the position (x,y) is equal to zero, and the status identifier $s_{x,y}$ for the position (x,y) is equal to a second value, e.g. 1, if the position (x,y) is available, e.g. is located inside the matrix and has been already encoded, and the weight parameter at the position (x,y) is not equal to zero.

It has been found that such a context modeling scheme fits a wide range of neural networks.

In a further advantageous embodiment, the encoder to selects a context, again as detailed above, in dependence on a distance of a closest non-zero, e.g. previously encoded, weight parameter, e.g. in a matrix of weight vectors, present in a predetermined direction, when seen, e.g. considered, from the currently encoded weight parameter. Therein, for example, a predetermined number of weight parameters is considered in determining the distance of the closest non-zero weight parameter.

The direction can be indicated by e.g. to the left or at the left-hand side, on in a similar fashion.

It has been found that the compression can be improved by selecting the context in dependence on the distance of the closest non-zero weight parameter that has been encoded previously.

In a further advantageous embodiment, the encoder selects a context for the encoding of a zero flag, e.g. a syntax element "sig_flag", of the weight parameter or a sign flag, e.g. a syntax element "sign_flag", considering only a single one previously encoded weight parameter, which is adjacent to the currently encoded weight parameter.

Therein the currently encoded weight parameter could be located e.g. at a position (x,y) in a matrix of the weight parameters, and the previously encoded weight parameter could be located e.g. at a position (x−1,y) or (x,y−1). Adjacent can e.g. mean being a left neighbor, being an upper neighbor, being a direct neighbor, or the like.

For that, advantageously, the encoder can determine a status identifier for the single one previously encoded weight parameter, wherein the status identifier equals to a first value, e.g. 0, if the single one previously encoded weight parameter is not available or the weight parameter at the position (x,y) is equal to zero. The status identifier equals to a second value, e.g. 1, if the single one previously encoded weight parameter is smaller than zero. And the status identifier equals to a third value, e.g. 2, if the single one previously encoded weight parameter is larger than 0. The encoder then selects the context, e.g. out of three contexts, in dependence on the status identifier.

Therein "not available" means e.g. the previously encoded weight parameter is located outside of a matrix of the weight parameters or has not yet been encoded.

It has been found that the compression can be improved by selecting the context considering only one previously encoded weight parameter, which advantageously is adjacent to the currently encoded weight parameter.

In a further advantageous embodiment, the encoder selects different contexts in dependence on whether the previously encoded weight parameter is smaller than zero, equal to zero or larger than zero.

It has been found that the compression can be improved, when the context for the currently encoded weight parameter is dependent on whether the previously encoded weight parameter is smaller, equal or larger than zero.

In a further advantageous embodiment, the encoder selects a context associated with a zero value of the previously encoded weight parameter in case the previously encoded weight parameter is not available.

Therein "not available" means e.g. the previously encoded weight parameter is located outside of a matrix of the weight parameters or has not yet been encoded.

It has been found that the compression can be improved, when the context associated with a zero value is dependent on whether the previously encoded weight parameter is available or not.

In a further advantageous embodiment, the encoder arithmetically encodes binary values of a unary code or of a truncated unary code representing an absolute value of weight parameter, or a most significant portion thereof.

It has been found that using the encoder to encode binary values of a (truncated) unary code allows to use the invention for neural networks operating that way, utilizing their inherent simplicity and robustness.

In a further advantageous embodiment, the encoder arithmetically encodes binary values of a truncated unary code, wherein the binary values of the truncated unary code describe whether the absolute value of the weight parameter is larger than respective threshold values associated to bit positions of the binary values. Therein the encoder provides the truncated unary code associated with a given weight parameter such that the truncated unary code terminates with a binary value, e.g. 0, indicating that the weight parameter is not larger than a respective threshold value associated to a bit position of the last binary value of the truncated unary code, in case the given weight parameter is smaller than a predetermined value. Further the encoder provides the truncated unary code associated with another given weight parameter such that the truncated unary code terminates with a binary value, e.g. 1, indicating that the weight parameter is larger than a respective threshold value associated to a bit position of the last binary value of the truncated unary code, in case the given weight parameter is not smaller than, or alternatively larger than or equal to, a predetermined value, such that the truncated unary code does not comprise a termination binary value, but is limited in its length. Thereby, for example, a termination binary value of the unary code is selectively omitted, or a provision of further binary values is selectively omitted, in case that the unary code reaches a predetermined maximum allowable length and/or in case that a threshold value, e.g. X, associated with a current bit position or a next bit position is larger than or equal to a predetermined threshold value, e.g. abs_max.

It has been found that the compression efficiency can be increased since if the maximum absolute value abs_max is known at the encoder and decoder side, encoding of abs_level_greater_X syntax elements may be terminated, when for the next abs_level_greater_X to be transmitted, X>=abs_max holds.

In a further advantageous embodiment, the encoder arithmetically encodes binary values of a unary code or of a truncated unary code, which describe whether the absolute value of the weight parameter is larger than a respective threshold value associated to a respective bit position of the respective binary value. Therein the differences between threshold values associated with adjacent bit positions are constant in a first range of bit positions, e.g. by increasing X by one in the first range of bit positions, and increase exponentially in a second range of bit positions following the first range of bit positions, e.g. by increasing X according to X=X+2k in the second range of bit positions, wherein k is then increased by one with increasing bit position.

It has been found that the compression can be improved for a corresponding unary code by an aspect of the present invention.

In a further advantageous embodiment, the differences between threshold values associated with adjacent bit positions are constant, e.g. equal to a difference between a last-but one threshold value and a last threshold value on the second range of bit positions, in a third range of bit positions following the second range of bit positions.

It has been found that compression efficiency can be improved with constant differences between threshold values associated with adjacent bit positions.

In a further advantageous embodiment, the encoder selects different contexts for an encoding of bits at different positions of the unary code or of the truncated unary code, e.g. in dependence on a bit position X, wherein, for example, a bit at a bit position X indicates whether the absolute value of the weight parameter to be encoded is larger than X.

It has been found that by selecting the context in dependence on the bit position, the compression can be improved.

In a further advantageous embodiment, the encoder selects a context out of two possible contexts for an encoding of a bit at a given bit position, e.g. a bit position X, of the unary code or of the truncated unary code in dependence on a sign of the currently encoded weight parameter, e.g. in dependence on a sign flag, e.g. a syntax element "sign_flag".

Another possibility is that the encoder selects contexts out of two possible contexts per bit position for an encoding of bits in a first range of one or more bit positions, e.g. for bit positions with X smaller than a predetermined number, e.g. X', of the unary code or of the truncated unary code in dependence on a sign of the currently encoded parameter, e.g. in dependence on a sign flag, e.g. a syntax element "sign_flag", and optionally also in dependence on the bit position. The encoder selects contexts for an encoding of bits in a second range of one or more bit positions, e.g. for bit positions X with X larger than or equal to the predetermined number, e.g. X', of the unary code or of the truncated unary code independent from the sign of the currently encoded weight parameter, e.g. only depending on the bit position X.

It has been found that selecting context out of two possible contexts for encoding of bits can also improve compression efficiency.

In a further advantageous embodiment, the encoder encodes bits in the second range of one or more bit positions of the unary code or of the truncated unary code, e.g. abs_level_greater_X flags with X greater or equal to a predefined number X', using a predetermined, e.g. fixed, context or using a bypass mode of the arithmetic coding.

In a further advantageous embodiment, the encoder encodes a fixed bit remainder of the absolute value of the weight parameter, e.g. a least significant portion of the absolute value of the weight parameter, using a predetermined, e.g. fixed, context or using a bypass mode of the arithmetic coding.

It has been found that by using a fixed context of bypass mode for a certain range of bit positions or for a fixed bit remainder, compression can be improved.

In a further advantageous embodiment, the encoder arithmetically encodes a plurality of binary values, e.g. abs_level_greater_X, wherein X may, for example, increase in steps of 1 or in steps larger than 1 or in increasing steps, of a unary code or of a truncated unary code representing an absolute value of weight parameter, or a most significant portion thereof.

It has been found that encoding the binary values of a unary code can increase the compression efficiency as well.

In a further advantageous embodiment, the binary values, e.g. abs_level_greater_X, of the unary code or of the truncated unary code indicate whether the absolute value of the weight parameter, e.g. the currently encoded weight parameter, is larger than X.

It has been found that if the unary code is constructed in such a manner, the compression can be in particular efficient.

In a further advantageous embodiment, the encoder selects a context for an encoding of a binary value abs_level_greater_X under consideration out of two possible contexts, e.g. in dependence on the sign of the weight parameter, in case X is smaller than a predetermined value, e.g. X', and to use a predetermined context associated with a bit position, which is independent from the sign, and may not be dependent on the bit position, in case X is larger than or equal to the predetermined value.

It has been found that selecting the context in such a manner can also improve compression.

In a further advantageous embodiment, the weight parameters are, at least logically, organized in rows and columns of a matrix. Therein, for example, weighting values associated with different input signals of a given i-th neuron of a given layer may be arranged in an i-th row, and wherein weighting values associated with a j-th input signal of the given layer may be arranged in a j-th column, or wherein, for example, weighting values associated with different input signals of a given i-th neuron of a given layer may be arranged in an i-th column, and wherein weighting values associated with a j-th input signal of the given layer may be arranged in a j-th row.

Thereby an order in which the weight parameters are encoded is along a first row or column of the matrix, then along a subsequent second row or column of the matrix, e.g. in the same direction both in the first and second row or column, or in opposite directions in the first and second row or column.

It has been found that if the matrix is organized in such a manner, compression according to an aspect of the present invention is particularly efficient.

In another aspect of the present invention the same concepts and principles as described above for an encoder can be applied for a decoder, and thus they are not repeated. Decoding naturally is associated with decompression accordingly.

In particular, another aspect of the present invention is a decoder for decoding weight parameters of a neural network. The decoder obtains a plurality bits representing weight parameters of the neural network, and decodes the weight parameters using a context-dependent arithmetic coding. In that the decoder selects a context for decoding a weight parameter or a syntax element of a number representation of the weight parameter. The selection is performed in dependence on one or more previously decoded weight parameters and/or syntax elements of a number representation of one or more weight parameters. Then the decoder decodes the weight parameter or syntax element of the weight parameter, using the selected context.

The weight parameters can e.g. be wi or qi or li, and the neural network can for example be a quantized version of a neural network. The context-dependent arithmetic coding can for example be a context-adaptive binary arithmetic coding, CABAC, wherein, also as an example, probabilities of bin values are determined for different contexts, and wherein, for example, each bin is associated with a context.

The decoder selects a context, e.g. a context having a context index C, for the decoding, which can be an arithmetic decoding, of the weight parameter, e.g. wi. Alternatively, a syntax element, e.g. a zero flag “sig_flag” or a sign flag “sign_flag”, can be decoded, possibly arithmetically. The syntax element can also be a decoded representation of an absolute value of the weight parameter or a decoded representation of most significant part of the absolute value of the weight parameter, which can for example be a unary sequence of bins, or a truncated unary sequence of bins. Further, the syntax elements can also be a decoded representation of a least significant part of the absolute value of the weight parameter, e.g. a fixed length sequence.

The syntax element refers to a number representation, e.g. a rounded or quantized number representation, of the weight parameter.

And the decoder selects the context in dependence on previously decoded weight parameters, e.g. wi and/or syntax elements of a number representation of one or more weight parameters.

It has been found that decoding with a context depending on previously decoded weight parameters or syntax elements is beneficial for the compression of a neural network.

In an advantageous embodiment, the decoder determines probabilities for bin values of a given bin associated with a given context in dependence on one or more previously decoded bin values associated with the given context.

Therein a bin can e.g. be representing a zero flag or a sign flag of the weight parameter, or a bit of an absolute value representation of the weight parameter. Bin values can for example be binary, i.e. 0 and 1. Each bin is associated with a context, but can also be associated with more than one context.

The decoded bin values associated with the context or contexts can for example refer to values of bin, which can represent a zero flag, a sign flag, or one or more bits of absolute value representations of previously decoded weight parameters.

It has been found that the probabilities of these elements can be determined from the previously decoded weight parameters.

In another advantageous embodiments the decoder selects the context for decoding of the zero flag of the weight parameter in one of the following manners, wherein the weight parameter refers to the currently decoded weight parameter.

The selection can be performed in dependence on a sign of a previously decoded weight parameter.

The selection can be performed out of at least three different zero flag contexts. The selection chooses one of the three contexts in dependence whether the previously decoded weight parameter is equal to zero, smaller than zero, or larger than zero.

The selection can be performed in dependence on whether a currently decoded weight parameter is a first weight parameter in a scanning row or a scanning column of a matrix of weight parameters.

An example for this is whether an x-index of a currently decoded weight parameter takes a lowest possible value of, for example 0, for a scanning order from a smallest x-index towards larger x-indices.

Another example is whether an x-index of a currently decoded weight parameter takes a largest possible value for a scanning order from a largest x-index towards smaller x-indices.

A further example is whether a y-index of a currently decoded weight parameter takes a lowest possible value of, for example 0, for a scanning order from a smallest y-index towards larger y-indices.

Yet another example is whether a y-index of a currently decoded weight parameter takes a largest possible value for a scanning order from a largest y-index towards smaller y-indices.

Therein, for example, a predetermined context is selectively used in the currently decoded weight parameter is a first weight parameter in the scanning row or the scanning column of a matrix of weight parameters.

The selection can be performed in dependence on whether a weight parameter preceding the currently decoded weight parameter has already been decoded and/or is available.

In this case, preceding refers, for example, to a scan direction of a scanning row or a scanning column of a matrix of weight parameters.

The selection criteria can also be combined such that the selection is performed such that a first context is selected if a previously decoded weight parameter is zero and a weight parameter preceding the currently decoded weight parameter has not yet been decoded and is not available, while a second context is selected if the previously decoded weight parameter is smaller than zero, and a third context is selected if the previously decoded weight parameter is larger than zero.

In other words, the first context for decoding of a zero flag of the weight parameter, e.g. the currently decoded weight parameter, is selected in case that a previously decoded weight parameter is zero and in case that a weight parameter preceding the currently decoded weight parameter, for example, when considering a scan direction of a scanning row or a scanning column of a matrix of weight parameters, has not yet been decoded and in case that a weight parameter preceding the currently decoded weight parameter, for example, when considering a scan direction of a scanning row or a scanning column of a matrix of weight parameters, is not available, e.g. a position of the weight parameter preceding the currently decoded weight parameter, when considering the scan direction, is outside of the weight matrix.

The second context for a decoding of a zero flag of the weight parameter, e.g. the currently decoded weight parameter, in case that the previously decoded weight parameter, which is e.g. preceding the currently decoded weight parameter, is smaller than zero.

Finally, the third context for a decoding of a zero flag of the weight parameter, e.g. the currently decoded weight parameter, is selected in case that the previously decoded weight parameter, which again is e.g. preceding the currently decoded weight parameter, is larger than zero.

Again, the decoding can be arithmetical decoding, and the zero flag can e.g. be a syntax element "sig_flag".

It has been found that selecting the context for the zero flag according to above criteria can improve the compression.

In another advantageous embodiment, the decoder determines a plurality of status identifiers representing statuses of a plurality of weight parameters at a plurality of positions relative to a position of a currently decoded weight parameter in the form of a numeric value. The decoder then combines, e.g. linearly, the status identifiers, in order to obtain a context index value representing a context of the currently decoded weight parameter. The currently decoded weight parameter, can for example be a zero flag, e.g. a syntax element "sig_flag", of the currently decoded weight parameter. Therein, for example, each possible constellation or combination of status identifier values is mapped to a context value or even to a unique context value.

The status identifiers can e.g. be called sx−1,y, sx,y−1, sx−1,y−1 and can represent statuses as for example an availability, a decoding status (i.e. already decoded or not), a zero-status (i.e. equal to zero or not), a sign, a magnitude (e.g. an absolute value), and so on.

An example for a combination is according to C=sx−1,y+3*sx,y−1+9*sx−1,y−1. The obtained context index can then e.g. be C.

Advantageously therefor, the decoder selects a context, as detailed above, in dependence on how many zero-valued, e.g. previously decoded, weight parameters and/or unavailable weight parameters in a row are adjacent to the currently decoded weight parameter.

Unavailable weight parameters can e.g. be called Ix−1,y, Ix−2,y, Ix−3,y and be represented by status identifiers sx−1,y, sx−2,y, sx−3,y.

Further advantageously therefor, the plurality of weight parameters is arranged in a matrix, and the weight parameters are denoted as Ix−1,y, Ix−2,y and Ix−3,y and correspond to positions (x−1,y), (x−2,y) and (x−3,y) in the matrix, respectively, and are represented by status identifiers sx−1,y, sx−2,y, sx−3,y.

It is further possible that the plurality of weight parameters is arranged in a matrix, and a status identifier sx,y for a position (x,y) in the matrix is equal to a first value, e.g. 0, if the position (x,y) is not available, e.g. is located outside of the matrix or has not yet been decoded, or the weight parameter at the position (x,y) is equal to zero, the status identifier sx,y for the position (x,y) is equal a second value, e.g. 1, if the weight parameter at the position (x,y) is smaller than zero, and the status identifier sx,y for the position (x,y) is equal to a third value, e.g. 2, if the weight parameter at the position (x,y) is larger than 0.

Alternatively, the plurality of weight parameters is arranged in a matrix, and a status identifier sx,y for a position (x,y) in the matrix is equal to a first value, e.g. 0, if the position (x,y) is not available, e.g. is located outside of the matrix or has not yet been decoded, or the weight parameter at the position (x,y) is equal to zero, and the status identifier sx,y for the position (x,y) is equal to a second value, e.g. 1, if the position (x,y) is available, e.g. is located inside the matrix and has been already decoded, and the weight parameter at the position (x,y) is not equal to zero.

It has been found that such a context modeling scheme fits a wide range of neural networks.

In a further advantageous embodiment, the decoder to selects a context, again as detailed above, in dependence on a distance of a closest non-zero, e.g. previously decoded, weight parameter, e.g. in a matrix of weight vectors, present in a predetermined direction, when seen, e.g. considered, from the currently decoded weight parameter. Therein, for example, a predetermined number of weight parameters is considered in determining the distance of the closest non-zero weight parameter.

The direction can be indicated by e.g. to the left or at the left-hand side, on in a similar fashion.

It has been found that the compression can be improved by selecting the context in dependence on the distance of the closest non-zero weight parameter that has been decoded previously.

In a further advantageous embodiment, the decoder selects a context for the decoding of a zero flag, e.g. a syntax element "sig_flag", of the weight parameter or a sign flag, e.g. a syntax element "sign_flag", considering only a single one previously decoded weight parameter, which is adjacent to the currently decoded weight parameter.

Therein the currently decoded weight parameter could be located e.g. at a position (x,y) in a matrix of the weight parameters, and the previously decoded weight parameter could be located e.g. at a position (x−1,y) or (x,y−1). Adjacent can e.g. mean being a left neighbor, being an upper neighbor, being a direct neighbor, or the like.

For that, advantageously, the decoder can determine a status identifier for the single one previously decoded weight parameter, wherein the status identifier equals to a first value, e.g. 0, if the single one previously decoded weight parameter is not available or the weight parameter at the position (x,y) is equal to zero. The status identifier equals to a second value, e.g. 1, if the single one previously decoded weight parameter is smaller than zero. And the status identifier equals to a third value, e.g. 2, if the single one previously decoded weight parameter is larger than 0. The decoder then selects the context, e.g. out of three contexts, in dependence on the status identifier.

Therein "not available" means e.g. the previously decoded weight parameter is located outside of a matrix of the weight parameters or has not yet been decoded.

It has been found that the compression can be improved by selecting the context considering only one previously decoded weight parameter, which advantageously is adjacent to the currently decoded weight parameter.

In a further advantageous embodiment, the decoder selects different contexts in dependence on whether the previously decoded weight parameter is smaller than zero, equal to zero or larger than zero.

It has been found that the compression can be improved, when the context for the currently decoded weight parameter is dependent on whether the previously decoded weight parameter is smaller, equal or larger than zero.

In a further advantageous embodiment, the decoder selects a context associated with a zero value of the previously decoded weight parameter in case the previously decoded weight parameter is not available.

Therein "not available" means e.g. the previously decoded weight parameter is located outside of a matrix of the weight parameters or has not yet been decoded.

It has been found that the compression can be improved, when the context associated with a zero value is dependent on whether the previously decoded weight parameter is available or not.

In a further advantageous embodiment, the decoder arithmetically decodes binary values of a unary code or of a truncated unary code representing an absolute value of weight parameter, or a most significant portion thereof.

It has been found that using the decoder to decode binary values of a (truncated) unary code allows to use an aspect of the invention for neural networks operating that way, utilizing their inherent simplicity and robustness.

In a further advantageous embodiment, the decoder arithmetically decodes binary values of a truncated unary code, wherein the binary values of the truncated unary code describe whether the absolute value of the weight parameter is larger than respective threshold values associated to bit positions of the binary values. Therein the decoder provides the truncated unary code associated with a given weight parameter such that the truncated unary code terminates with a binary value, e.g. 0, indicating that the weight parameter is not larger than a respective threshold value associated to a bit position of the last binary value of the truncated unary code, in case the given weight parameter is smaller than a predetermined value. Further the decoder provides the truncated unary code associated with another given weight parameter such that the truncated unary code terminates with a binary value, e.g. 1, indicating that the weight parameter is larger than a respective threshold value associated to a bit position of the last binary value of the truncated unary code, in case the given weight parameter is not smaller than, or alternatively larger than or equal to, a predetermined value, such that the truncated unary code does not comprise a termination binary value, but is limited in its length. Thereby, for example, a termination binary value of the unary code is selectively omitted, or a provision of further binary values is selectively omitted, in case that the unary code reaches a predetermined maximum allowable length and/or in case that a threshold value, e.g. X, associated with a current bit position or a next bit position is larger than or equal to a predetermined threshold value, e.g. abs_max.

It has been found that the compression efficiency can be increased since if the maximum absolute value abs_max is known at the decoder and decoder side, decoding of abs_level_greater_X syntax elements may be terminated, when for the next abs_level_greater_X to be transmitted, X>=abs_max holds.

In a further advantageous embodiment, the decoder arithmetically decodes binary values of a unary code or of a truncated unary code, which describe whether the absolute value of the weight parameter is larger than a respective threshold value associated to a respective bit position of the respective binary value. Therein the differences between threshold values associated with adjacent bit positions are constant in a first range of bit positions, e.g. by increasing X by one in the first range of bit positions, and increase exponentially in a second range of bit positions following the first range of bit positions, e.g. by increasing X according to X=X+2k in the second range of bit positions, wherein k is then increased by one with increasing bit position.

It has been found that the compression can be improved for a corresponding unary code by an aspect of the present invention.

In a further advantageous embodiment, the differences between threshold values associated with adjacent bit positions are constant, e.g. equal to a difference between a last-but one threshold value and a last threshold value on the second range of bit positions, in a third range of bit positions following the second range of bit positions.

It has been found that compression efficiency can be improved with constant differences between threshold values associated with adjacent bit positions.

In a further advantageous embodiment, the decoder selects different contexts for a decoding of bits at different positions of the unary code or of the truncated unary code, e.g. in dependence on a bit position X, wherein, for example, a bit at a bit position X indicates whether the absolute value of the weight parameter to be decoded is larger than X.

It has been found that by selecting the context in dependence on the bit position, the compression can be improved.

In a further advantageous embodiment, the decoder selects a context out of two possible contexts for a decoding of a bit at a given bit position, e.g. a bit position X, of the unary code or of the truncated unary code in dependence on a sign of the currently decoded weight parameter, e.g. in dependence on a sign flag, e.g. a syntax element "sign_flag".

Another possibility is that the decoder selects contexts out of two possible contexts per bit position for a decoding of bits in a first range of one or more bit positions, e.g. for bit positions X with X smaller than a predetermined number, e.g. X', of the unary code or of the truncated unary code in dependence on a sign of the currently decoded parameter, e.g. in dependence on a sign flag, e.g. a syntax element "sign_flag", and optionally also in dependence on the bit position. The decoder selects contexts for a decoding of bits in a second range of one or more bit positions, e.g. for bit positions X with X larger than or equal to the predetermined number, e.g. X', of the unary code or of the truncated unary code independent from the sign of the currently decoded weight parameter, e.g. only depending on the bit position X.

It has been found that selecting context out of two possible contexts for decoding of bits can also improve compression efficiency.

In a further advantageous embodiment, the decoder decodes bits in the second range of one or more bit positions of the unary code or of the truncated unary code, e.g. abs_level_greater_X flags with X greater or equal to a predefined number X', using a predetermined, e.g. fixed, context or using a bypass mode of the arithmetic coding.

In a further advantageous embodiment, the decoder decodes a fixed bit remainder of the absolute value of the weight parameter, e.g. a least significant portion of the absolute value of the weight parameter, using a predetermined, e.g. fixed, context or using a bypass mode of the arithmetic coding.

It has been found that by using a fixed context of bypass mode for a certain range of bit positions or for a fixed bit remainder, compression can be improved.

In a further advantageous embodiment, the decoder arithmetically decodes a plurality of binary values, e.g. abs_level_greater_X, wherein X may, for example, increase in steps of 1 or in steps larger than 1 or in increasing steps, of a unary code or of a truncated unary code representing an absolute value of weight parameter, or a most significant portion thereof.

It has been found that decoding the binary values of a unary code can increase the compression efficiency as well.

In a further advantageous embodiment, the binary values, e.g. abs_level_greater_X, of the unary code or of the truncated unary code indicate whether the absolute value of the weight parameter, e.g. the currently decoded weight parameter, is larger than X.

It has been found that if the unary code is constructed in such a manner, the compression can be in particular efficient.

In a further advantageous embodiment, the decoder selects a context for a decoding of a binary value abs_level_greater_X under consideration out of two possible contexts, e.g. in dependence on the sign of the weight parameter, in case X is smaller than a predetermined value, e.g. X', and to use a predetermined context associated with a bit position, which is independent from the sign, and may not be dependent on the bit position, in case X is larger than or equal to the predetermined value.

It has been found that selecting the context in such a manner can also improve compression.

In a further advantageous embodiment, the weight parameters are, at least logically, organized in rows and columns of a matrix. Therein, for example, weighting values associated with different input signals of a given i-th neuron of a given layer may be arranged in an i-th row, and wherein weighting values associated with a j-th input signal of the given layer may be arranged in a j-th column, or wherein, for example, weighting values associated with different input signals of a given i-th neuron of a given layer may be arranged in an i-th column, and wherein weighting values associated with a j-th input signal of the given layer may be arranged in a j-th row.

Thereby an order in which the weight parameters are decoded is along a first row or column of the matrix, then along a subsequent second row or column of the matrix, e.g. in the same direction both in the first and second row or column, or in opposite directions in the first and second row or column.

It has been found that if the matrix is organized in such a manner, compression according to an aspect of the present invention is particularly efficient.

In another aspect of the present invention, a quantizer for quantizing weight parameters of a neural network is described. The quantizer obtains a plurality of input weight parameters, e.g. $w_i$, of the neural network, and determines a quantized weight parameter, e.g. $q_i$, on the basis of the input weight parameter, e.g. $w_i$, using distortion measures $D_{i,k}$, describing an expected distortion caused by a usage of different quantized values, e.g. $q_{i,k}$, e.g. different quantization steps, instead of an unquantized input weight parameter and using bit amount values, e.g. $R_{i,k}$, describing estimated or computed bit efforts for a representation, e.g. encoding or arithmetic encoding, of different quantized values, e.g. $q_{i,k}$.

It has been found that by using such distortion measures for determining the quantized weight parameters, quantizing of weight parameters of a neural network can be improved.

In an advantageous embodiment, the quantizer determines the distortion measure in dependence on a computed or estimated variance, e.g. $\sigma_i^2$ of the input weight parameter, for example, such that the distortion measure describes an expected distortion caused by the use of a given quantized value relative to the computed or estimated variance.

It has been found that determining the distortion measure in dependence on a computed or estimated variance improves quantizing.

In a further advantageous embodiment, the quantizer computes a quotient $$D_{i,k} = \frac{1}{\sigma_i^2}(w_i - q_{i,k})^2$$

between a quadratic error, e.g. $(W_i-q_{i,k})^2$, describing a deviation between an input weight parameter and a quantized value, and a computed or estimated variance, e.g. $\sigma_i^2$, e.g. a square of a standard deviation $\sigma_i$, of the input weight parameter, in order to obtain a distortion measure, e.g. $D_{i,k}$, associated with an input weight parameter, e.g. $w_i$, and a quantized value, e.g. $q_{i,k}$.

It has been found that computing the distortion measure in such manner is particularly efficient.

In a further advantageous embodiment, the quantizer evaluates a cost function, e.g. $cost_{i,k}=D_{i,k}+\lambda*R_{ik}$, which combines a distortion measure, e.g. $D_{i,k}$, and a bit amount value, e.g. $R_{i,k}$, for a plurality of possible quantized values, for example, designated by index k, associated with a given input weight parameter, e.g. $w_i$, and selects a quantized value as the quantized weight parameter associated with the given input weight parameter in dependence on the evaluation of the cost function, e.g. such that the quantized weight parameter minimizes the cost function.

It has been found that in order to get a good trade-off between compression efficiency and prediction accuracy a cost function as described above may be evaluated and a rate-distortion optimized quantization may be applied.

In a further advantageous embodiment, the quantizer selects a quantized weight parameter, e.g. $q_i$, associated with a given input weight parameter, e.g. $w_i$, to minimize above cost function over an index k, wherein $D_{i,k}$ is a distortion measure describing an expected, e.g. absolute or relative, e.g. related to an expected variance, distortion caused by a usage of a quantized value having index k, e.g. $q_{i,k}$, e.g. different quantization steps, instead of an unquantized input weight parameter, e.g. $w_i$, wherein, for example, $D_{i,k}$ is a function of $w_i$, $q_{i,k}$ and the determined or estimated variance $\sigma_i^2$ of the weight parameter. Also, $R_{i,k}$ is a bit amount value describing an estimated or computed number of bits needed to represent a quantized value, or a candidate quantized value, having index k, e.g. $q_{i,k}$, and wherein $\lambda$ is a predetermined value.

It has been found that by minimizing the cost function, the compression efficiency can be improved.

In a further advantageous embodiment, the quantizer obtains the bit amount value, e.g. $R_{i,k}$, in dependence on an estimated or computed number of bits needed for an encoding or an arithmetic encoding of different quantized values, e.g. into a bitstream.

It has been found that by obtaining the bit amount value in dependence on the number of bits needed for encoding, the quantizing efficiency can be improved.

In a further advantageous embodiment, the quantizer determines the quantized weight parameter, e.g. $q_i$, such that the distortion measure associated with the determined quantized weight parameter is smaller than or equal to a predetermined value, e.g. such that the deviation between the input weight parameter and the determined quantized weight parameter is smaller than the standard deviation of the input weight parameter or, at most, equal to the standard deviation of the input weight parameter.

It has been found that if the distortion measure is smaller or equal to a predetermined value, whereby the accuracy of the prediction can be improved.

In a further advantageous embodiment, the quantizer obtains a variance information, e.g. $\sigma_i^2$, describing variances of weight parameters using a learning algorithm, e.g. a training algorithm, training the neural network, e.g. the artificial neural network.

It has been found that obtaining the variance information by training can improve the quality of the variance information, and thus the accuracy of the prediction.

In a further advantageous embodiment, the quantizer obtains, as the input weight parameters, a mean value information, e.g. $\sigma_i^2$, describing mean values of weight parameters using a learning algorithm, e.g. a training algorithm, training the neural network, e.g. the artificial neural network, wherein the mean value information is then quantized by the quantizer, e.g. for efficient storage or for efficient operation of a neural network, or for efficient encoding and transmission in a bit stream.

It has been found, as mentioned above, that thereby storage or operation in connection with a neural network can be made more efficient.

In a further advantageous embodiment, the quantizer determines the bit amount values in dependence on a context for a context-based arithmetic encoding of the quantized weight parameter, wherein, for example, it can be determined or estimated by the quantizer how many bits will be needed for an arithmetic encoding of different quantized weight parameter values in view of a current context, wherein the current context may be determined by previously encoded quantized weight parameters.

It has been found that by determining the bit amount value in dependence on a context for a context-based arithmetic encoding, the quantizing efficiency can be improved.

In a further aspect of the present invention, an encoder for encoding weight parameters of a neural network is described, which comprises a quantizer as described above. Therein the quantizer obtains quantized weight parameters on the basis of an input weight parameters, and the encoder encodes the quantized weight parameters, e.g. $q_i$, of the neural network, e.g. a quantized version, using a context-dependent arithmetic coding, e.g. using a context-adaptive binary arithmetic coding, CABAC, wherein, for example, probabilities of bin values are determined for different contexts, wherein, for example, each bin is associated with a context.

Such an encoder advantageously comprises any feature or combination of features or functionality of the encoder described above.

It has been found that an encoder comprising a quantizer as described above improves the encoding operation.

Further aspects refer to corresponding methods for encoding, decoding and quantizing weight parameters of a neural network.

These methods are based on the same considerations as the above-described apparatuses. However, it should be noted that each of the methods can be supplemented by any of the features, functionalities and details described herein, also with respect to the apparatuses. Moreover, the methods can be supplemented by the features, functionalities, and details of the apparatuses, both individually and taken in combination.

In particular, the methods for encoding and decoding comprise obtaining a plurality of weight parameters, e.g. $w_i$ or $q_i$ or $l_i$, of the neural network, and encoding or decoding the weight parameters, e.g. $w_i$ or $q_i$ or $l_i$, of the neural network, e.g. a quantized version, using a context-dependent arithmetic coding, e.g. using a context-adaptive binary arithmetic coding, CABAC, wherein, for example, probabilities of bin values are determined for different contexts, wherein, for example, each bin is associated with a context.

A further aspect of the present invention refers to a computer program for performing the methods described herein, when the computer program runs on a computer.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
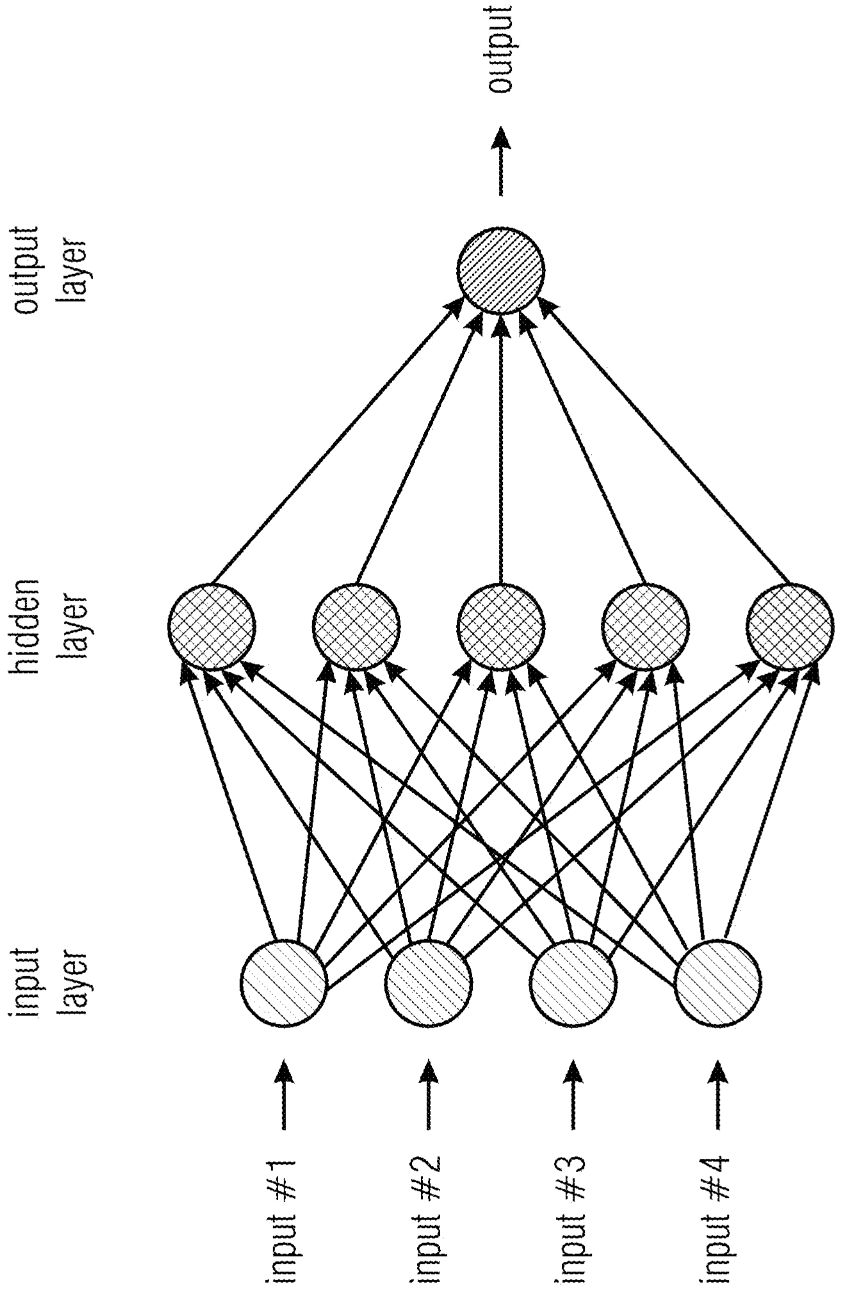
FIG. 1 shows a graph representation of a feed forward neural network.

In the following, some approaches for the determination of neural network coefficients will be described, which may for example be used in combination with the further concepts disclosed herein. However it should be noted that different approaches for the determination of the coefficients of a neural network may also be used.

For example, the here presented apparatus applies a relevance estimation based on the later Bayesian approach. Concretely, it applies the algorithm presented in "Variational Dropout Sparsifies Deep Neural Networks" (Dmitry Molchanov; arXiv:1701.05369, 2017). The algorithm can be applied in order to estimate the optimal mean and variances for each weight parameter of the network for solving the particular task. Once these have been estimated, a relevance-weighted quantization algorithm is applied on to the mean values of the weight parameters.

Concretely, it uses the standard deviation of each parameter as a measure of the interval-size where quantization is allowed (more on this later).

The apparatus proposes two options for the estimation of the mean and variances.

The first option applies the algorithm fully as described in above document. Thus, it trains both, the mean and variances of each weight parameter in order to attain the optimal configuration for solving the task. The initialization of the means may be either random or taken from pretrained network. This approach comes with the advantage that the resulting network may be highly quantized and compressed. However, it is disadvantageous that it involves high computational resources in order to be trained. Here, an entire training set of data may be used for the estimation of the mean and variances.

The second option does not have the disadvantage as the first one, i.e. involving high computational resources, as it takes a pretrained network as initialization and fixes its parameters as the mean of the distribution (thus, are unchanged). Then, only the variances of each parameters are estimated by applying the algorithm indicated above. Whilst this approach may not attain as high compression gains, it comes with the advantage that the computational resources are greatly reduced, since this option only estimates the variances. This method may be applied if the entire training set of data is available, or only a subset of data samples (such as a validation set).

The algorithm indicated above redefines the forward propagation method into a stochastic algorithm and minimizes a variational objective instead. Concretely, the algorithm attempts to minimize a regularized objective $$\mathcal{L}(\phi) = \mathcal{L}_{\mathcal{D}}(\phi) - D_{KL}(q_\phi(w)\|p(w))$$

where the first term tries to find the mean and variances of each parameter (as parametrized by psi) that solve the task well, and the other attempts to sparsify the means and to maximize the variances.

Hence, the second option attempts to find the maximum variances (or perturbations) that may be applied to the pretrained values of the network while minimally affecting the accuracy of it. And the first option attempts to additionally find a network with maximal number of 0 means. Therefore, we usually attain higher compression gains when we apply the first option, but at the expense of having to apply high computational resources for the estimation.

In the following, an approach will be described, which may, for example, be used for the quantization of parameters of a neural network (for example, for the quantization of parameters determined as described above). The quantization approach may, for example, be used in combination with any of the other concepts disclosed herein, but may also be used individually.

Quantization: Based on the estimated mean and variances of the network, the apparatus applies a context-adaptive relevance-weighted quantization method on to the mean values of the parameter.

Figure 4:
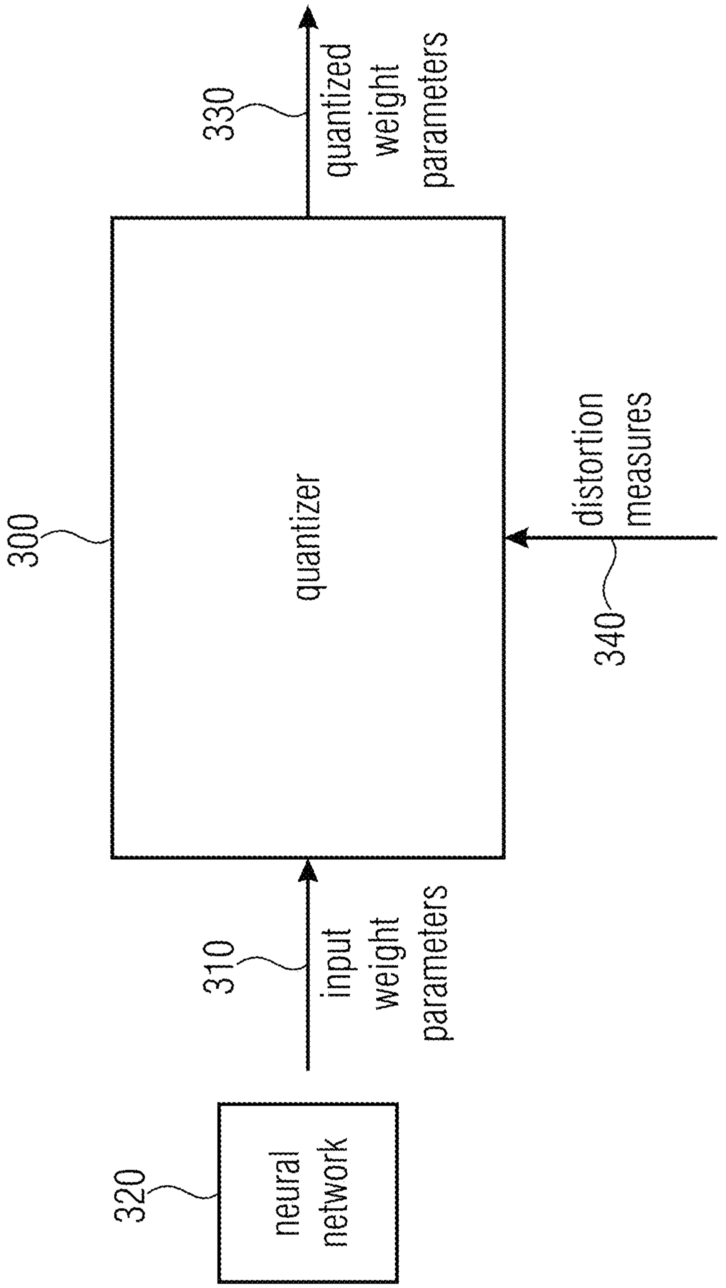
FIG. 4 shows an exemplary embodiment of a quantizer according to an aspect of the present invention.

FIG. 4 shows an example for a quantizer according to an aspect of the present invention. It is shown that a quantizer 300 for quantizing weight parameters of a neural network 320 obtains a plurality of input weight parameters 310 of the neural network 320. The quantizer 300 determines a quantized weight parameter 330 on the basis of an input weight parameter 310 using distortion measures 340 describing an expected distortion caused by a usage of different quantized values instead of an unquantized input weight parameter and using bit amount values describing estimated or computed bit efforts for a representation of different quantized values.

However, it should be noted that different quantization concepts/quantization architectures can be used. In the following some optional details, which may be used for the quantization, e.g. for the quantization of neural network parameters, will be described, which can be used both individually and may be taken in combination.

Distortion measure: The following weighted distance measure $$D_{i,k} = \frac{1}{\sigma_i^2}(w_i - q_{i,k})^2$$

may, for example, be employed as distortion measure, where $w_i$ is the i-th weight of a sequence of weights and where $\sigma_i$; is the associated standard deviation and where $q_{i,k}$ is the k-th one of a number of possible quantized versions of $w_i$. Note that the distortion value $D_{i,k}$ doesn't exceed 1 if the quantized weight $q_{i,k}$ lies inside the respective standard deviation interval.

The quantized versions of a given weight are derived through quantization function (Q(·) which may, for example, constrain the quantized values $q_{i,k}$ to be equidistant, allowing for fixed-point representations.

Rate-distortion optimized quantization: In order to get a good trade-off between compression efficiency and prediction accuracy a rate-distortion optimized quantization may be applied. Therefore, a cost function may be defined $$\text{cost}_{i,k} = D_{i,k} + \lambda \cdot R_{i,k}$$

for each candidate quantized weight $q_{ik}$, with a distortion measure $D_{i,k}$ and a bit amount $R_{i,k}$. Parameter $\lambda$ controls the operation point and may be chosen depending on the actual application. For example, the distortion measure $D_{i,k}$ as described above may be applied. Depending on the encoding algorithm, the bit amount $R_{i,k}$ may be estimated. It is the number of bits that may be used to encode $q_{i,k}$ into the bit stream. Then, given, $\lambda$, the cost function $\text{cost}_{i,k}$ is minimized over k.

It may further be of interest to only allow quantized weights for which $D_{i,k}$ doesn't exceed 1. In this case, the quantized weight $q_{i,k}$ is guaranteed to stay within the standard deviation interval of the weight $w_i$.

In the following, concepts for lossless encoding and decoding, for example for lossless encoding and decoding of neural network parameters, or of quantized neural network parameters, will be described. The concepts for lossless encoding and decoding may, for example be used in combination with the neural network parameter determination described above and/or in combination with the quantization as described above, but may also be taken individually.

Lossless encoding and decoding: If a uniform quantizer is applied in the previous step, the quantized weight parameters may be represented by an integer value (weight levels) and a scaling factor. The scaling factor can be referred to as quantization step size, which may, for example, be fixed for a whole layer. In order to restore all quantized weight parameters of a layer, the step size and dimensions of the layer may be known by the decoder. They may, for example, be transmitted separately. In this case. The binary patterns are simply written to the bitstream, starting with the dimensions (integer) followed by the step size Δ (e.g. 32 bit float number).

Encoding of integers with context-adaptive binary arithmetic coding (CABAC): The quantized weight levels (integer representation) may then be transmitted using entropy coding techniques. Therefore, a layer of weights is mapped onto a sequence of quantized weight levels using a scan.

Figure 2:
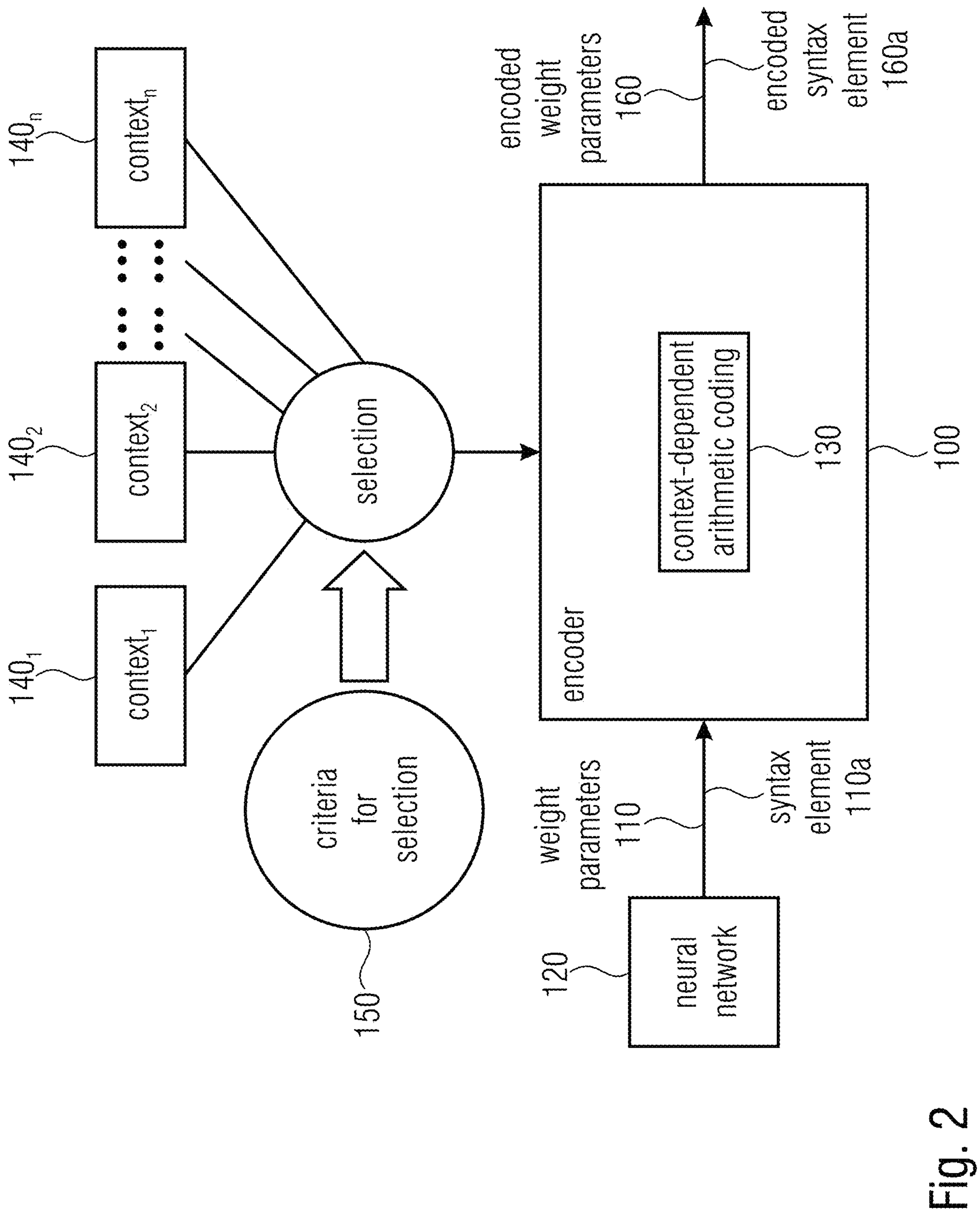
FIG. 2 shows an exemplary embodiment of an encoder according to an aspect of the present invention.

FIG. 2 shows an example for an encoder according to an aspect of the present invention. It is shown that an encoder 100 for encoding weight parameters 110 of a neural network 120 obtains a plurality of weight parameters 110 of the neural network 120. Then the encoder 100 encodes the weight parameters 110 of the neural network 120 using a context-dependent arithmetic coding 130, wherein the encoder 100 selects a context out of several available contexts $\mathbf{140}_1$, $\mathbf{140}_2$, . . . 140*n* for an encoding of one weight parameter 110, or for an encoding of a syntax element 110*a* of a number representation of the weight parameter. The selection is performed in dependence on certain criteria 150 for selection. This document describes many possible options for this criterion 150. One possible criterion 150 is that the selection is performed in dependence on one or more previously encoded weight parameters and/or in dependence on one or more previously encoded syntax elements of a number representation of one or more weight parameters. The encoder encodes the weight parameter 110, or the syntax element 110*a* of the weight parameter, using the selected context.

However, it should be noted that different encoding concepts can be used. In the following some optional details, which may be used for the encoding, e.g. for the encoding of neural network parameters, will be described, which can be used both individually and may be taken in combination.

As an optional example, in an advantageous embodiment, a row-first scan order is used, starting with the upper-most row of the matrix, encoding the contained values from left to right. In this way, all rows are encoded from the top to the bottom.

As another optional example, in another advantageous embodiment, the matrix is transposed before applying the row-first scan.

As another optional example, in another advantageous embodiment, the matrix is flipped horizontally and/or vertically and/or rotated by 90/180/270 degree to the left or right, before the row-first scan is applied.

For coding of the levels CABAC (Context-Adaptive Binary Arithmetic Coding) is used. Details can be found in "Context-Based Adaptive Binary Arithmetic Coding in the H.264/AVC Video Compression Standard" (D. Marpe, et al.; IEEE transactions on circuits and systems for video technology, Vol. 13, No. 7, pp. 620-636, July 2003). So, a quantized weight level l is decomposed in a series of binary symbols or syntax elements, which then may be handed to the binary arithmetic coder (CABAC).

In the first step, a binary syntax element sig_flag is derived for the quantized weight level, which specifies whether the corresponding level is equal to zero. If the sig_flag is equal to one a further binary syntax elements sign_flag is derived. The bin indicates if the current weight level is positive (e.g. bin=0) or negative (e.g. bin=1).

Next, a unary sequence of bins is encoded, followed by a fixed length sequence as follows:

A variable k is initialized with a non-negative integer and X is initialized with 1 <<k.

One or more syntax elements abs_level_greater_X are encoded, which indicate, that the absolute value of the quantized weight level is greater than X. If abs_level_greater_X is equal to 1, the variable k is updated (for example, increased by 1), then 1<<k is added to X and a further abs_level_greater_X is encoded. This procedure is continued until an abs_level_greater_X is equal to 0. Afterwards, a fixed length code of length k suffices to complete the encoding of the quantized weight index. For example, a variable rem=X−|l| could be encoded using k bits. Or alternatively, a variable rem' could be defined as $$\text{rem}' = (1 \ll k) - \text{rem} - 1$$

which is encoded using k bits. Any other mapping of the variable rem to a fixed length code of k bits may alternatively be used.

When increasing k by 1 after each abs_level_greater_X, this approach is identical to applying exponential Golomb coding (if the sign_flag is not regarded).

Additionally, if the maximum absolute value abs_max is known at the encoder and decoder side, encoding of abs_level_greater_X syntax elements may be terminated, when for the next abs_level_greater_X to be transmitted, X>=abs_max holds.

Decoding of integers with CABAC: Decoding of the quantized weight levels (integer representation) works analogously to the encoding.

Figure 3:
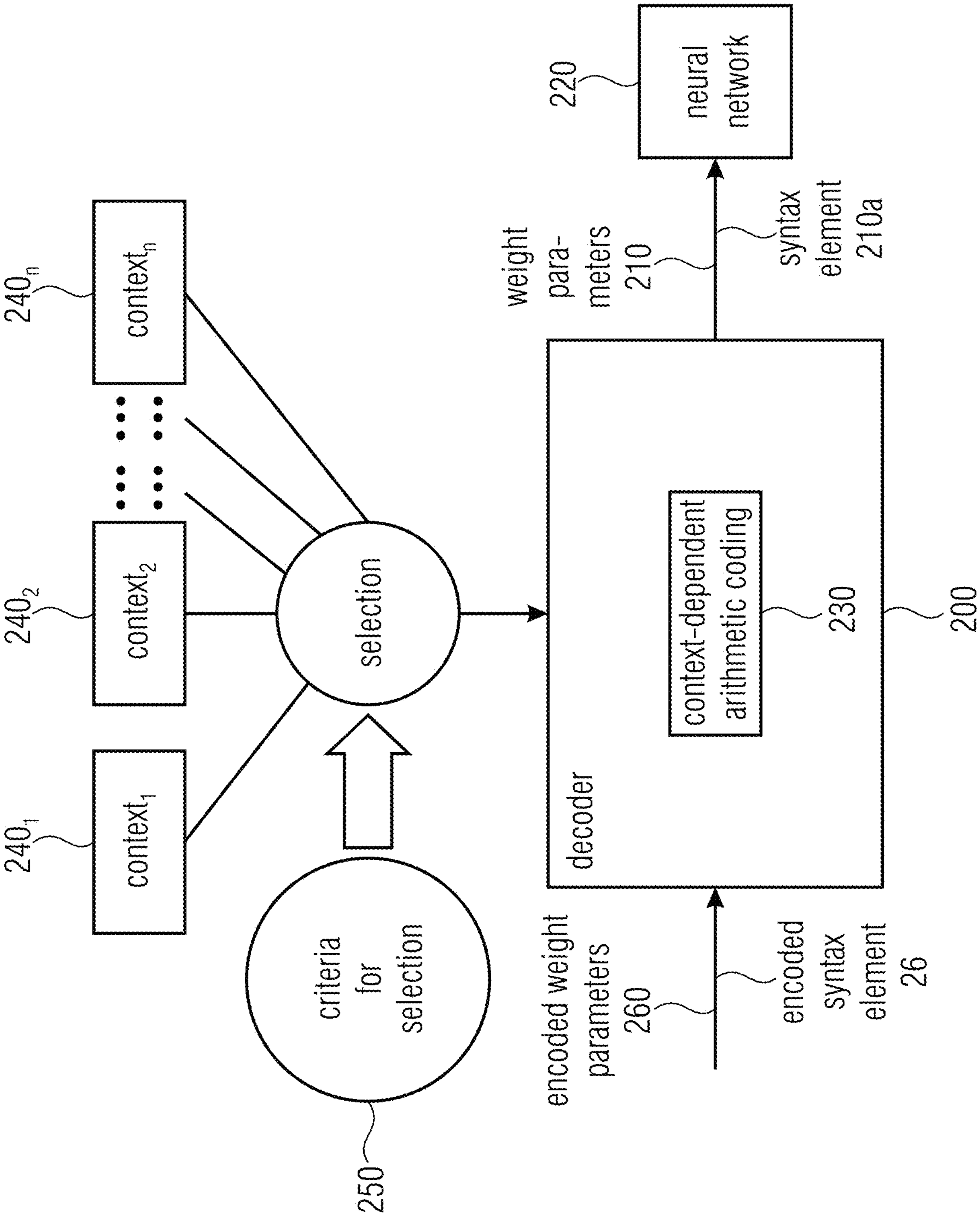
FIG. 3 shows an exemplary embodiment of a decoder according to an aspect of the present invention.

FIG. 3 shows an example for a decoder according to an aspect of the present invention. It is shown that a decoder 200 for decoding weight parameters 260 of a neural network 220 obtains a plurality of weight parameters 260 of the neural network 220. Then the decoder 200 decodes the weight parameters 260 of the neural network 220 using a context-dependent arithmetic coding 230, wherein the decoder 200 selects a context out of several available contexts $\mathbf{240}_1$, $\mathbf{240}_2$, . . . 240*n* for a decoding of one weight parameter 260, or for a decoding of a syntax element 260*a* of a number representation of the weight parameter. The selection is performed in dependence on certain criteria 250 for selection. This document describes many possible options for this criterion 250. One possible criterion 250 is that the selection is performed in dependence on one or more previously decoded weight parameters and/or in dependence on one or more previously decoded syntax elements of a number representation of one or more weight parameters. The decoder decodes the weight parameter 260, or the syntax element 260*a* of the weight parameter, using the selected context.

However, it should be noted that different decoding concepts can be used. In the following some optional details, which may be used for the decoding, e.g. for the decoding of neural network parameters, will be described, which can be used both individually and may be taken in combination.

The decoder first decodes the sig_flag. If it is equal to one, a sign_flag and a unary sequence of abs_level_greater_X follows, where the updates of k, (and thus increments of X) will follow the same rule as in the encoder. Finally, the fixed length code of k bits is decoded and interpreted as integer number (e.g. as rem or rem', depending on which of both was encoded). The absolute value of the decoded quantized weight level |l| may then be reconstructed from X, and form the fixed length part. For example, if rem was used as fixed-length part, |l|=X−rem. Or alternatively, if rem' was encoded, $$|l| = X + 1 + \text{rem}' - (1 \ll k).$$

As a last step, the sign needs to be applied to |l| in dependence on the decoded sign_flag, yielding the quantized weight level l. Finally, the quantized weight q is reconstructed by multiplying the quantized weight level l with the step size Δ.

In an advantageous embodiment, k is initialized with 0 and updated as follows. After each abs_level_greater_X equal to 1, the update of k that may be performed is done according to the following rule: If X>X', k is incremented by 1 where X' is a constant depending on the application. For example, X' is a number (e.g. between 0 and 100) that is derived by the encoder and signaled to the decoder.

Context modeling: In the CABAC entropy coding, most syntax elements for the quantized weight levels are coded using a binary probability modelling. Each binary decision (bin) is associated with a context. A context represents a probability model for a class of coded bins. The probability for one of the two possible bin values is estimated for each context based on the values of the bins that have been already coded with the corresponding context. Different context modelling approaches may be applied, depending on the application. Usually, for several bins related to the quantized weight coding, the context, that is used for coding, is selected based on already transmitted syntax elements. Different probability estimators may be chosen, for example SBMP (State-Based Multi-Parameter estimator), or those of HEVC or VTM-4.0, depending on the actual application. The choice affects, for example, the compression efficiency and complexity.

Details for SBMP can be found in "JVET-K0430-v3—CE5-related: State-based probability estimator" (H. Kirchhoffer, et al.; in JVET, Ljubljana, 2018).

Further details for HEVC can be found in "ITU-T H.265 High efficiency video coding" (ITU—International Telecommunication Union, Series H: Audiovisual and multimedia systems—Infrastructure of audiovisual services—Coding of moving video, April 2015).

And details for VTM-4.0 can be found in "JVET-M1001-v6—Versatile Video Coding (Draft 4)" (B. Bross, et al.; in *JVET*, Marrakech, 2019).

A context modeling scheme that fits a wide range of neural networks is described as follows. For decoding a quantized weight level l at a particular position (x,y) in the weight matrix, a local template is applied to the current position. This template contains a number of other (ordered) positions like e.g. (x−1, y), (x, y−1), (x−1, y−1), etc. For each position, a status identifier is derived.

In an advantageous embodiment (denoted Si1), a status identifier $s_{x,y}$ for a position (x,y) is derived as follows: If position (x,y) points outside of the matrix, or if the quantized weight level $l_{x,y}$ at position (x,y) is not yet decoded or equals zero, the status identifier $s_{x,y}=0$. Otherwise, the status identifier shall be $s_{xy}=l_{xy}<0?1:2$.

In another advantageous embodiment (denoted Si2), a status identifier $s_{x,y}$ for a position (x,y) is derived as follows: If position (x,y) points outside of the matrix, or if the quantized weight level $l_{x,y}$ at position (x,y) is not yet decoded or equals zero, the status identifier $s_{x,y}=0$. Otherwise, the status identifier shall be $s_{x,y}=1$.

For a particular template, a sequence of status identifiers is derived, and each possible constellation of the values of the status identifiers is mapped to a context index, identifying a context to be used. The template, and the mapping may be different for different syntax elements. For example, from a template containing the (ordered) positions (x−1, y), (x, y−1), (x−1, y−1) an ordered sequence of status identifiers $s_{x-1,y}$, $s_{x,y-1}$, $s_{x-1,y-1}$ is derived. For example, this sequence may be mapped to a context index $C=s_{x-1,y}+3*s_{x,y-1}+9*s_{x-1,y-1}$. For example, the context index C may be used to identify a number of contexts for the sig_flag.

In an advantageous embodiment (denoted approach 1), the local template for the sig_flag or for the sign_flag of the quantized weight level $l_{x,y}$ at position (x,y) consists of only one position (x−1, y) (i.e. the left neighbor). The associated status identifier $s_{x-1,y}$ is derived according to advantageous embodiment Si1.

For the sig_flag, one out of three contexts is selected depending on the value of $s_{x-1,y}$ or for the sign_flag, one out of three other contexts is selected depending on the value of $s_{x-1,y}$.

In another advantageous embodiment (denoted approach 2), the local template for the sig flag contains the three ordered positions (x−1, y), (x−2, y), (x−3, y). The associated sequence of status identifiers $s_{x-1,y}$, $s_{x-2,y}$, $s_{x-3,y}$ is derived according to advantageous embodiment Si2.

For the sig_flag, the context index C is derived as follows: If $$s_{x-1,y} \neq 0,$$

then C=0. Otherwise, if $$s_{x-2,y} \neq 0,$$

then C=1. Otherwise, if $$s_{x-3,y} \neq 0,$$

then C=2. Otherwise, C=3.

This may also be expressed by the following equation:

$$C = (s_{x-1,y} \neq 0)?0: \left((s_{x-2,y} \neq 0)?1: \left((s_{x-3,y} \neq 0)?2: 3\right)\right)$$

In the same manner, the number of neighbors to the left may be increased or decreased so that the context index C equals the distance to the next nonzero weight to the left (not exceeding the template size).

Each abs_level_greater_X flag may, for example, apply an own set of two contexts. One out of the two contexts is then chosen depending on the value of the sign_flag.

In an advantageous embodiment, for abs_level_greater_X flags with X smaller than a predefined number X', different contexts are distinguished depending on X and/or on the value of the sign_flag.

In an advantageous embodiment, for abs_level_greater_X flags with X greater or equal to a predefined number X', different contexts are distinguished only depending on X.

In another advantageous embodiment, abs_level_greater_X flags with X greater or equal to a predefined number X' are encoded using a fixed code length of 1 (e.g. using the bypass mode of an arithmetic coder).

Furthermore, some or all of the syntax elements may also be encoded without the use of a context. Instead, they are encoded with a fixed length of 1 bit. E.g. using a so-called bypass bin of CABAC.

In another advantageous embodiment, the fixed-length remainder rem is encoded using the bypass mode.

In another advantageous embodiment, the encoder determines a predefined number X', distinguishes for each syntax element abs_level_greater_X with X<X' two contexts depending on the sign, and uses for each abs_level_greater_X with X>=X' one context.

Particularly Advantageous Aspects

According to an aspect of the present invention, the estimated standard deviation of each parameter can be interpreted as the respective relevance score and accordingly weight the distortion measure of the quantization step.

Further, context adaptive quantization method can be applied based on the distribution of the mean parameter values and their variances.

Finally, the decoding procedure can be adapted in order to be able to perform efficient dot product operations.

Any of these concepts may optionally be used in any of the embodiments, in combination with any other aspect or taken individually.

Generalizations

The here presented apparatus (or, generally speaking, any of the embodiments disclosed herein) may be generalized and adapted to other relevance score measures. Namely, the distortion function that is applied in the quantization procedure may be generalized to $$D_i=R_i d(w_i, q(w_i))$$

where now d(.,.) may be any distance measure and $R_i$ any relevance score measure.

However, any other distortion function can also be used optionally. It may even be possible to combine more than one distortion function to generate a distortion measure for use with any of the concepts described herein.

Other work: There have been some work where they suggested to apply a weighted entropy-constrained quantization algorithm. Details can be found in "Towards the limit of network quantization" (Yoojin Choi, et al.; CoRR, abs/1612.01543, 2016) and "Weighted-entropy-based quantization for deep neural networks" (Eunhyeok Park, et al.; in CVPR, 2017). However, their quantization algorithm is based on the entropy-constrained Lloyd algorithm for scalar quantization (see also "Source Coding: Part I of Fundamentals of Source and Video Coding" (Thomas Wiegand and Heiko Schwarz, Foundations and Trends® in Signal Processing: Vol. 4: No. 1-2, 2011)) and does therefore not apply any context-based adaptation algorithm, neither any optimizations that aim to improve the associated dot product algorithm. Moreover, in contrast to the method applied in this document, their relevance scores are based on Taylor-expansion methods or parameters magnitude-based methods.

However, it has been found that the concepts described in above mentioned document can optionally be used—individually or in combination—with one or more aspects of the present document.

EMBODIMENTS

1. An encoder (100) for encoding weight parameters (110) of a neural network (120) wherein the encoder is configured to obtain a plurality of weight parameters of the neural network; wherein the encoder is configured to encode the weight parameters of the neural network using a context-dependent arithmetic coding (130); wherein the encoder is configured to select a context (140*i*, $\mathbf{140}_2$, . . . $\mathbf{140}_n$) for an encoding of a weight parameter, or for an encoding of a syntax element (110*a*) of a number representation of the weight parameter, in dependence on one or more previously encoded weight parameters (150) and/or in dependence on one or more previously encoded syntax elements (150) of a number representation of one or more weight parameters; and wherein the encoder is configured to encode the weight parameter, or a syntax element of the weight parameter, using the selected context.

2. The encoder of embodiment 1, wherein the encoder is configured to determine probabilities for bin values of a given bin associated with a given context in dependence on one or more previously encoded bin values associated with the given context.

3. The encoder of any one of the preceding embodiments, wherein the encoder is configured to select a context for the encoding of a zero flag of the weight parameter in dependence on a sign of a previously encoded weight parameter.

4. The encoder of any one of the preceding embodiments, wherein the encoder is configured to select a context for the encoding of a zero flag of the weight parameter out of at least three different zero flag contexts.

5. The encoder of any one of the preceding embodiments, wherein the encoder is configured to select a context for the encoding of a zero flag of the weight parameter in dependence on whether a currently encoded weight parameter is a first weight parameter in a scanning row of a matrix of weight parameters.

6. The encoder of any one of the preceding embodiments, wherein the encoder is configured to select the context for an encoding of a zero flag of the weight parameter in dependence whether a weight parameter preceding the currently encoded weight parameter has already been encoded and/or is available.

7. The encoder of any one of the preceding embodiments, wherein the encoder is configured to select a first context for an encoding of a zero flag of the weight parameter in case that a previously encoded weight parameter is zero and in case that a weight parameter preceding the currently encoded weight parameter has not yet been encoded and in case that a weight parameter preceding the currently encoded weight parameter is not available, and to select a second context for an encoding of a zero flag of the weight parameter in case that the previously encoded weight parameter is smaller than zero, and to select a third context for an encoding of a zero flag of the weight parameter in case that the previously encoded weight parameter is larger than zero.

8. The encoder of any one of the preceding embodiments, wherein the encoder is configured to determine a plurality of status identifies representing statuses of a plurality of weight parameters at a plurality of positions relative to a position of a currently encoded weight parameter in the form of a numeric value, and to combine the status identifiers, in order to obtain a context index value representing a context of the currently encoded weight parameter.

9. The encoder of any one of the preceding embodiments, wherein the encoder is configured to select a context for the encoding of a zero flag of the weight parameter in dependence on how many zero-valued weight parameters and/or unavailable weight parameters in a row are adjacent to the currently encoded weight parameter.

10. The encoder of embodiment 9, wherein the plurality of weight parameters is arranged in a matrix, and the weight parameters are denoted as $l_x$–$i_{,y}$, $l_x$–2,y and $l_x$–$3_{,y}$ and correspond to positions (x–1,y), (x–2,y) and (x–3,y) in the matrix, respectively, and are represented by status identifiers $s_x$–i y, $s_x$–2,y, $s_x$–$3_{,y}$.

11. The encoder of embodiment 8 or embodiment 10, wherein the plurality of weight parameters is arranged in a matrix, and a status identifier $s_{x,y}$ for a position (x,y) in the matrix is equal to a first value, if the position (x,y) is not available or the weight parameter at the position (x,y) is equal to zero, the status identifier $s_{x,y}$ for the position (x,y) is equal a second value, if the weight parameter at the position (x,y) is smaller than zero, and the status identifier $s_{x,y}$ for the position (x,y) is equal to a third value, if the weight parameter at the position (x,y) is larger than 0.

12. The encoder of embodiment 8 or embodiment 10, wherein the plurality of weight parameters is arranged in a matrix, and a status identifier $s_{x,y}$ for a position (x,y) in the matrix is equal to a first value, if the position (x,y) is not available or the weight parameter at the position (x,y) is equal to zero, and the status identifier $s_{x,y}$ for the position (x,y) is equal to a second value, if the position (x,y) is available and the weight parameter at the position (x,y) is not equal to zero.

13. The encoder of any one of the preceding embodiments wherein the encoder is configured to select a context for the encoding of a zero flag of the weight parameter in dependence on a distance of a closest non-zero weight parameter present in a predetermined direction, when seen from the currently encoded weight parameter.

14. The encoder of any one of the preceding embodiments, wherein the encoder is configured to select a context for the encoding of a zero flag of the weight parameter considering only a single one previously encoded weight parameter, which is adjacent to the currently encoded weight parameter.

15. The encoder of embodiment 14, wherein the encoder is configured to determine a status identifier for the single one previously encoded weight position, wherein the status identifier for the single one previously encoded weight parameter equals to a first value, if the single one previously encoded weight parameter is not available or the weight parameter at the position (x,y) is equal to zero, equals to a second value, if the single one previously encoded weight parameter is smaller than zero, and equals to a third values, if the single one previously encoded weight parameter is larger than 0; and wherein the encoder is configured to select the context in dependence on the status identifier.

16. The encoder of any one of the preceding embodiments, wherein the encoder is configured to select different contexts in dependent on whether the previously encoded weight parameter is smaller than zero, equal to zero or larger than zero.

17. The encoder of any one of the preceding embodiments wherein the encoder is configured to select a context associated with a zero value of the previously encoded weight parameter in case the previously encoded weight parameter is not available.

18. The encoder of any one of the preceding embodiments, wherein the encoder is configured to arithmetically encode binary values of a unary code or of a truncated unary code representing an absolute value of weight parameter, or a most significant portion thereof.

19. The encoder of any one of the preceding embodiments, wherein the encoder is configured to arithmetically encode binary values of a truncated unary code, wherein the binary values of the truncated unary code describe whether the absolute value of the weight parameter is larger than respective threshold values associated to bit positions of the binary values, wherein the encoder is configured to provide the truncated unary code associated with a given weight parameter such that the truncated unary code terminates with a binary value indicating that the weight parameter is not larger than a respective threshold value associated to a bit position of the last binary value of the truncated unary code, in case the given weight parameter is smaller than a predetermined value, and wherein the encoder is configured to provide the truncated unary code associated with another given weight parameter such that the truncated unary code terminates with a binary value indicating that the weight parameter is larger than a respective threshold value associated to a bit position of the last binary value of the truncated unary code, in case the given weight parameter is not smaller than a predetermined value.

20. The encoder of any one of the preceding embodiments, wherein the encoder is configured to arithmetically encode binary values of a unary code or of a truncated unary code, wherein the binary values of the unary code or of the truncated unary code describe whether the absolute value of the weight parameter is larger than a respective threshold value associated to a respective bit position of the respective binary value, wherein differences between threshold values associated with adjacent bit positions are constant in a first range of bit positions, and wherein differences between threshold values associated with adjacent bit positions increase exponentially in a second range of bit positions following the first range of bit positions.

21. The encoder of any one of the preceding embodiments, wherein differences between threshold values associated with adjacent bit positions are constant in a third range of bit positions following the second range of bit positions.

22. The encoder of any one of the preceding embodiments, wherein the encoder is configured to select different contexts for an encoding of bits at different positions of the unary code or of the truncated unary code.

23. The encoder of any one of the preceding embodiments, wherein the encoder is configured to select a context out of two possible contexts for an encoding of a bit at a given bit position of the unary code or of the truncated unary code in dependence on a sign of the currently encoded weight parameter.

24. The encoder of any one of the preceding embodiments, wherein the encoder is configured to select contexts out of two possible contexts per bit position for an encoding of bits in a first range of one or more bit positions of the unary code or of the truncated unary code in dependence on a sign of the currently encoded parameter, and wherein the encoder is configured to select contexts for an encoding of bits in a second range of one or more bit positions of the unary code or of the truncated unary code independent from the sign of the currently encoded weight parameter.

25. The encoder of any one of the preceding embodiments, wherein the encoder is configured to encode bits in the second range of one or more bit positions of the unary code or of the truncated unary code using a predetermined context or using a bypass mode of the arithmetic coding.

26. The encoder of any one of the preceding embodiments, wherein the encoder is configured to encode a fixed bit remainder of the absolute value of the weight parameter using a predetermined context or using a bypass mode of the arithmetic coding.

27. The encoder of any one of the preceding embodiments, wherein the encoder is configured to arithmetically encode a plurality of binary values of a unary code or of a truncated unary code representing an absolute value of weight parameter, or a most significant portion thereof.

28. The encoder of any one of the preceding embodiments, wherein the binary values of the unary code or of the truncated unary code indicate whether the absolute value of the weight parameter is larger than X.

29. The encoder of any one of the preceding embodiments, wherein the encoder is configured to select a context for an encoding of a binary value abs_level_greater_X under consideration out of two possible contexts in case X is smaller than a predetermined value and to use a predetermined context associated with a bit position in case X is larger than or equal to the predetermined value.

30. The encoder according to any of the preceding embodiments, wherein the weight parameters are organized in rows and columns of a matrix, wherein an order in which the weight parameters are encoded is along a first row of the matrix, then along a subsequent second row of the matrix, or wherein an order in which the weight parameters are encoded is along a first column of the matrix, then along a subsequent second column of the matrix.

31. A decoder (200) for decoding weight parameters (260) of a neural network (220) wherein the decoder is configured to obtain a plurality bits representing weight parameters of the neural network; wherein the decoder is configured to decode the weight parameters of the neural network using a context-dependent arithmetic coding (230); wherein the decoder is configured to select a context (240*i*, $\mathbf{240}_2$, . . . 240*n*) for a decoding of a weight parameter, or for a decoding of a syntax element (260*a*) of a number representation of the weight parameter, in dependence on one or more previously decoded weight parameters (250) and/or in dependence on one or more previously decoded syntax elements (250) of a number representation of one or more weight parameters; and wherein the decoder is configured to decode the weight parameter, or a syntax element of the weight parameter, using the selected context.

32. The decoder of embodiment 31, wherein the decoder is configured to determine probabilities for bin values of a given bin associated with a given context in dependence on one or more previously decoded bin values associated with the given context.

33. The decoder of any one of embodiments 31 to 32, wherein the decoder is configured to select a context for the decoding of a zero flag of the weight parameter in dependence on a sign of a previously decoded weight parameter.

34. The decoder of any one of embodiments 31 to 33, wherein the decoder is configured to select a context for the decoding of a zero flag of the weight parameter out of at least three different zero flag contexts.

35. The decoder of any one of embodiments 31 to 34, wherein the decoder is configured to select a context for the decoding of a zero flag of the weight parameter in dependence on whether a currently decoded weight parameter is a first weight parameter in a scanning row of a matrix of weight parameters.

36. The decoder of any one of embodiments 31 to 35, wherein the decoder is configured to select the context for a decoding of a zero flag of the weight parameter in dependence whether a weight parameter preceding the currently decoded weight parameter has already been decoded and/or is available.

37. The decoder of any one of embodiments 31 to 36, wherein the decoder is configured to select a first context for a decoding of a zero flag of the weight parameter in case that a previously decoded weight parameter is zero and in case that a weight parameter preceding the currently decoded weight parameter has not yet been decoded and in case that a weight parameter preceding the currently decoded weight parameter is not available, and to select a second context for a decoding of a zero flag of the weight parameter in case that the previously decoded weight parameter is smaller than zero, and to select a third context for a decoding of a zero flag of the weight parameter in case that the previously decoded weight parameter is larger than zero.

38. The decoder of any one of embodiments 31 to 37, wherein the decoder is configured to determine a plurality of status identifies representing statuses of a plurality of weight parameters at a plurality of positions relative to a position of a currently decoded weight parameter in the form of a numeric value, and to combine the status identifiers, in order to obtain a context index value representing a context of the currently decoded weight parameter.

39. The decoder of any one of embodiments 31 to 38, wherein the decoder is configured to select a context for the decoding of a zero flag of the weight parameter in dependence on how many zero-valued weight parameters and/or unavailable weight parameters in a row are adjacent to the currently decoded weight parameter.

40. The decoder of embodiment 39, wherein the plurality of weight parameters is arranged in a matrix, and the weight parameters are denoted as $l_x{-}i_{,y}$, $l_{x-}2_{,y}$ and $l_{x-}3_{,y}$ and correspond to positions (x−1,y), (x−2,y) and (x−3,y) in the matrix, respectively, and are represented by status identifiers $s_{x-}i_y$, $s_x{-}2_{-y}$, $s_x{-}3_{,y}$.

41. The decoder of embodiment 38 or embodiment 40, wherein the plurality of weight parameters is arranged in a matrix, and a status identifier $s_{x,y}$ for a position (x,y) in the matrix is equal to a first value, if the position (x,y) is not available or the weight parameter at the position (x,y) is equal to zero, the status identifier $s_{x,y}$ for the position (x,y) is equal a second value, if the weight parameter at the position (x,y) is smaller than zero, and the status identifier $s_{x,y}$ for the position (x,y) is equal to a third value, if the weight parameter at the position (x,y) is larger than 0.

42. The decoder of embodiment 38 or embodiment 40, wherein the plurality of weight parameters is arranged in a matrix, and a status identifier $s_{x,y}$ for a position (x,y) in the matrix is equal to a first value, if the position (x,y) is not available or the weight parameter at the position (x,y) is equal to zero, and the status identifier $s_{x,y}$ for the position (x,y) is equal to a second value, if the position (x,y) is available and the weight parameter at the position (x,y) is not equal to zero.

43. The decoder of any one of embodiments 31 to 42, wherein the decoder is configured to select a context for the decoding of a zero flag of the weight parameter in dependence on a distance of a closest non-zero weight parameter present in a predetermined direction, when seen from the currently decoded weight parameter.

44. The decoder of any one of embodiments 31 to 43, wherein the decoder is configured to select a context for the decoding of a zero flag of the weight parameter considering only a single one previously decoded weight parameter, which is adjacent to the currently decoded weight parameter.

45. The decoder of embodiment 44, wherein the decoder is configured to determine a status identifier for the single one previously decoded weight position, wherein the status identifier for the single one previously decoded weight parameter equals to a first value, if the single one previously decoded weight parameter is not available or the weight parameter at the position (x,y) is equal to zero, equals to a second value, if the single one previously decoded weight parameter is smaller than zero, and equals to a third values, if the single one previously decoded weight parameter is larger than 0; and wherein the decoder is configured to select the context in dependence on the status identifier.

46. The decoder of any one of embodiments 31 to 45, wherein the decoder is configured to select different contexts in dependent on whether the previously decoded weight parameter is smaller than zero, equal to zero or larger than zero.

47. The decoder of any one of embodiments 31 to 46, wherein the decoder is configured to select a context associated with a zero value of the previously decoded weight parameter in case the previously decoded weight parameter is not available.

48. The decoder of any one of embodiments 31 to 47, wherein the decoder is configured to arithmetically decode binary values of a unary code or of a truncated unary code representing an absolute value of weight parameter, or a most significant portion thereof.

49. The decoder of any one of embodiments 31 to 47, wherein the decoder is configured to arithmetically decode binary values of a truncated unary code, wherein the binary values of the truncated unary code describe whether the absolute value of the weight parameter is larger than respective threshold values associated to bit positions of the binary values, wherein the decoder is configured to provide the truncated unary code associated with a given weight parameter such that the truncated unary code terminates with a binary value indicating that the weight parameter is not larger than a respective threshold value associated to a bit position of the last binary value of the truncated unary code, in case the given weight parameter is smaller than a predetermined value, and wherein the decoder is configured to provide the truncated unary code associated with another given weight parameter such that the truncated unary code terminates with a binary value indicating that the weight parameter is larger than a respective threshold value associated to a bit position of the last binary value of the truncated unary code, in case the given weight parameter is not smaller than a predetermined value.

50. The decoder of any one of embodiments 31 to 49, wherein the decoder is configured to arithmetically decode binary values of a unary code or of a truncated unary code, wherein the binary values of the unary code or of the truncated unary code describe whether the absolute value of the weight parameter is larger than a respective threshold value associated to a respective bit position of the respective binary value, wherein differences between threshold values associated with adjacent bit positions are constant in a first range of bit positions, and wherein differences between threshold values associated with adjacent bit positions increase exponentially in a second range of bit positions following the first range of bit positions.

51. The decoder of any one of embodiments 31 to 50, wherein differences between threshold values associated with adjacent bit positions are constant in a third range of bit positions following the second range of bit positions.

52. The decoder of any one of embodiments 31 to 51, wherein the decoder is configured to select different contexts for a decoding of bits at different positions of the unary code or of the truncated unary code.

53. The decoder of any one of embodiments 31 to 52, wherein the decoder is configured to select a context out of two possible contexts for a decoding of a bit at a given bit position of the unary code or of the truncated unary code in dependence on a sign of the currently decoded weight parameter.

54. The decoder of any one of embodiments 31 to 53, wherein the decoder is configured to select contexts out of two possible contexts per bit position for a decoding of bits in a first range of one or more bit positions of the unary code or of the truncated unary code in dependence on a sign of the currently decoded parameter, and wherein the decoder is configured to select contexts for a decoding of bits in a second range of one or more bit positions of the unary code or of the truncated unary code independent from the sign of the currently decoded weight parameter.

55. The decoder of any one of embodiments 31 to 54, wherein the decoder is configured to decode bits in the second range of one or more bit positions of the unary code or of the truncated unary code using a predetermined context or using a bypass mode of the arithmetic coding.

56. The decoder of any one of embodiments 31 to 55, wherein the decoder is configured to decode a fixed bit remainder of the absolute value of the weight parameter using a predetermined context or using a bypass mode of the arithmetic coding.

57. The decoder of any one of embodiments 31 to 56, wherein the decoder is configured to arithmetically decode a plurality of binary values of a unary code or of a truncated unary code representing an absolute value of weight parameter, or a most significant portion thereof.

58. The decoder of any one of embodiments 31 to 57, wherein the binary values of the unary code or of the truncated unary code indicate whether the absolute value of the weight parameter is larger than X.

59. The decoder of any one of embodiments 31 to 58, wherein the decoder is configured to select a context for a decoding of a binary value absJevel_greater_X under consideration out of two possible contexts in case X is smaller than a predetermined value and to use a predetermined context associated with a bit position in case X is larger than or equal to the predetermined value.

60. The decoder of any one of embodiments 31 to 59, wherein the weight parameters are organized in rows and columns of a matrix, wherein an order in which the weight parameters are decoded is along a first row of the matrix, then along a subsequent second row of the matrix, or wherein an order in which the weight parameters are decoded is along a first column of the matrix, then along a subsequent second column of the matrix.

61. A quantizer (300) for quantizing weight parameters of a neural network (320), wherein the quantizer is configured to obtain a plurality of input weight parameters (310) of the neural network (320); wherein the quantizer is configured to determine a quantized weight parameter (330) on the basis of an input weight parameter using distortion measures (340) describing an expected distortion caused by a usage of different quantized values instead of an unquantized input weight parameter and using bit amount values describing estimated or computed bit efforts for a representation of different quantized values.

62. The quantizer according to embodiment 61, wherein the quantizer is configured to determine the distortion measure in dependence on a computed or estimated variance of the input weight parameter.

63. The quantizer according to embodiment 61 or embodiment 62, wherein the quantizer is configured to compute a quotient between a quadratic error, describing a deviation between an input weight parameter and a quantized value, and a computed or estimated variance of the input weight parameter, in order to obtain a distortion measure associated with an input weight parameter and a quantized value.

64. The quantizer according to one of embodiments 61 to 63, wherein the quantizer is configured to evaluate a cost function, which combines a distortion measure and a bit amount value for a plurality of possible quantized values associated with a given input weight parameter, and to select a quantized value as the quantized weight parameter associated with the given input weight parameter in dependence of the evaluation of the cost function.

65. The quantizer according to one of embodiments 61 to 64, wherein the quantizer is configured to select a quantized weight parameter associated with a given input weight parameter to minimize a cost function $$\text{costi},k=Di,k+A*R_{i,k}$$

over an index k, wherein $D_{-k}$ is a distortion measure describing an expected distortion caused by a usage of a quantized value having index k instead of an unquantized input weight parameter; and wherein F¾,k is a bit amount value describing an estimated or computed number of bits needed to represent a quantized value having index k; and wherein l is a predetermined value.

66. The quantizer according to one of embodiments 61 to 65, wherein the quantizer is configured to obtain the bit amount value in dependence on an estimated or computed number of bits needed for an encoding or an arithmetic encoding of different quantized values.

67. The quantizer according to one of embodiments 61 to 66, wherein the quantizer is configured to determine the quantized weight parameter such that the distortion measure associated with the determined quantized weight parameter is smaller than or equal to a predetermined value.

68. The quantizer according to one of embodiments 61 to 67, wherein the quantizer is configured to obtain a variance information describing variances of weight parameters using a learning algorithm training the neural net.

69. The quantizer according to one of embodiments 61 to 68, wherein the quantizer is configured to obtain, as the input weight parameters, a mean value information describing mean values of weight parameters using a learning algorithm training the neural net.

70. The quantizer according to one of embodiments 61 to 69, wherein the quantizer is configured to determine the bit amount values in dependence on a context for a context-based arithmetic encoding of the quantized weight parameter.

71. An encoder for encoding weight parameters of a neural network, wherein the encoder comprises a quantizer according to one of embodiments 61 to 70, configured to obtain quantized weight parameters on the basis of an input weight parameters, wherein the encoder is configured to encode the quantized weight parameters of the neural network using a context-dependent arithmetic coding.

72. The encoder according to embodiment 71, wherein the encoder comprises any feature or combination of features or functionality of the encoder according to one of embodiments 1 to 30.

73. A method for encoding weight parameters of a neural network wherein the method comprises obtaining a plurality of weight parameters of the neural network; wherein the method comprises encoding the weight parameters of the neural network using a context-dependent arithmetic coding; wherein the method comprises selecting a context for an encoding of a weight parameter, or for an encoding of a syntax element of a number representation of the weight parameter, in dependence on one or more previously encoded weight parameters and/or in dependence on one or more previously encoded syntax elements of a number representation of one or more weight parameters; and wherein the weight parameter, or a syntax element of the weight parameter, is encoded using the selected context.

74. A method for decoding weight parameters of a neural network wherein the method comprises obtaining a plurality of bits representing weight parameters of the neural network; wherein the method comprises decoding the weight parameters of the neural network using a context-dependent arithmetic coding; wherein the method comprises selecting a context for a decoding of a weight parameter, or for a decoding of a syntax element of a number representation of the weight parameter, in dependence on one or more previously decoded weight parameters and/or in dependence on one or more previously decoded syntax elements of a number representation of one or more weight parameters; and wherein the weight parameter, or a syntax element of the weight parameter, is decoded using the selected context.

75. A method for quantizing weight parameters of a neural network, wherein the method comprises obtaining a plurality of input weight parameters of the neural network; wherein the method comprises determining a quantized weight parameter on the basis of an input weight parameter using distortion measures describing an expected distortion caused by a usage of different quantized values instead of an unquantized input weight parameter and using bit amount values describing estimated or computed bit efforts for a representation of different quantized values.

76. A method for encoding weight parameters of a neural network, wherein the method comprises quantizing a plurality of input weight parameters, to obtain quantized weight parameters on the basis of an input weight parameters, wherein the method comprises encoding the quantized weight parameters of the neural network using a context-dependent arithmetic coding.

77. A computer program for performing the method of one of embodiments 73 to 77 when the computer program runs on a computer.

Conclusions

To conclude, the embodiments described herein can optionally be supplemented by any of the important points or aspects described here. However, it is noted that the important points and aspects described here can either be used individually or in combination and can be introduced into any of the embodiments described herein, both individually and in combination.

Implementation Alternatives

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, one or more of the most important method steps may be executed by such an apparatus.

Depending on certain implementation requirements, embodiments of an aspect of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to an aspect of the invention comprise a data carrier having electronically readable control signals, which are capable of cooperating with a programmable computer system, such that one of the methods described herein is performed.

Generally, embodiments of an aspect of the present invention can be implemented as a computer program product with a program code, the program code being operative for performing one of the methods when the computer program product runs on a computer. The program code may for example be stored on a machine-readable carrier.

Other embodiments comprise the computer program for performing one of the methods described herein, stored on a machine-readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to an aspect of the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are advantageously performed by any hardware apparatus.

The apparatus described herein may be implemented using a hardware apparatus, or using a computer, or using a combination of a hardware apparatus and a computer.

The apparatus described herein, or any components of the apparatus described herein, may be implemented at least partially in hardware and/or in software.

The methods described herein may be performed using a hardware apparatus, or using a computer, or using a combination of a hardware apparatus and a computer.

The methods described herein, or any components of the apparatus described herein, may be performed at least partially by hardware and/or by software.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

We claim:

1. A decoder for decoding weight parameters of a neural network, the decoder comprising:

a communication interface;

a memory storing instructions; and a processor which is coupled to the communication interface and the memory, to execute the instructions stored in the memory to implement operations comprising:

acquiring a plurality of bits representing weight parameters of the neural network;

decoding the weight parameters of the neural network using a context-dependent arithmetic coding;

selecting a context for a decoding of a weight parameter, or for a decoding of a syntax element of a number representation of the weight parameter, in dependence on one or more previously decoded weight parameters and/or in dependence on one or more previously decoded syntax elements of a number representation of one or more weight parameters;

decoding the weight parameter, or a syntax element of the weight parameter, using the selected context; and selecting the context for a decoding of a zero flag of the weight parameter in dependence whether a weight parameter preceding the currently decoded weight parameter has already been decoded and/or is available.

2. The decoder of claim 1, wherein the operations further comprise:

selecting a context for the decoding of a zero flag of the weight parameter in dependence on a sign of a previously decoded weight parameter.

3. The decoder of claim 1, wherein the operations further comprise:

determining a plurality of status identifies representing statuses of a plurality of weight parameters at a plurality of positions relative to a position of a currently decoded weight parameter in the form of a numeric value, and combining the status identifiers, in order to acquire a context index value representing a context of the currently decoded weight parameter.

4. The decoder of claim 3, wherein the plurality of weight parameters is arranged in a matrix, and a status identifier $s_{x,y}$ for a position (x,y) in the matrix is equal to a first value, if the position (x,y) is not available or the weight parameter at the position (x,y) is equal to zero, the status identifier $s_{x,y}$ for the position (x,y) is equal a second value, if the weight parameter at the position (x,y) is smaller than zero, and the status identifier $s_{x,y}$ for the position (x,y) is equal to a third value, if the weight parameter at the position (x,y) is larger than 0, wherein the variables x and y represent matrix indices.

5. The decoder of claim 3, wherein the plurality of weight parameters is arranged in a matrix, and a status identifier $s_{x,y}$ for a position (x,y) in the matrix is equal to a first value, if the position (x,y) is not available or the weight parameter at the position (x,y) is equal to zero, and the status identifier $s_{x,y}$ for the position (x,y) is equal to a second value, if the position (x,y) is available and the weight parameter at the position (x,y) is not equal to zero, wherein the variables x and y represent matrix indices.

6. The decoder of claim 1, wherein the operations further comprise:

selecting a context for the decoding of a zero flag of the weight parameter in dependence on how many zero-valued weight parameters and/or unavailable weight parameters in a row are adjacent to a currently decoded weight parameter.

7. The decoder of claim 6, wherein the plurality of weight parameters is arranged in a matrix, and the weight parameters are denoted as $l_{x-1,y}$, $l_{x-2,y}$ and $l_{x-3,y}$ and correspond to positions (x−1, y), (x−2,y) and (x−3,y) in the matrix, respectively, and are represented by status identifiers $s_{x-1,y}$, $s_{x-2,y}$, $s_{x-3,y}$, wherein the variables x and y represent matrix indices.

8. The decoder of claim 1, wherein the operations further comprise:

selecting a context for the decoding of a zero flag of the weight parameter in dependence on a distance of a closest non-zero weight parameter present in a predetermined direction, when seen from a currently decoded weight parameter.

9. The decoder of claim 1, wherein the operations further comprise:

selecting a context for the decoding of a zero flag of the weight parameter considering only a single one previously decoded weight parameter, which is adjacent to a currently decoded weight parameter.

10. The decoder of claim 9, wherein the operations further comprise:

determining a status identifier for the single one previously decoded weight parameter, wherein the status identifier for the single one previously decoded weight parameter equals to a first value, if the single one previously decoded weight parameter is not available or the weight parameter at the position (x,y) is equal to zero, equals to a second value, if the single one previously decoded weight parameter is smaller than zero, and equals to a third value, if the single one previously decoded weight parameter is larger than 0; and selecting the context in dependence on the status identifier.

11. The decoder of claim 1, wherein the operations further comprise:

selecting a context associated with a zero value of the previously decoded weight parameter in case the previously decoded weight parameter is not available.

12. The decoder of claim 1, wherein the weight parameters are organized in rows and columns of a matrix, wherein an order in which the weight parameters are decoded is along a first row of the matrix, then along a subsequent second row of the matrix, or wherein an order in which the weight parameters are decoded is along a first column of the matrix, then along a subsequent second column of the matrix.

13. A non-transitory computer-readable medium for storing data associated with a data stream, wherein the data stream having weight parameters of the neural network is decodable using a decoder according to claim 1.

14. A method for decoding weight parameters of a neural network, the method comprising:

acquiring a plurality of bits representing weight parameters of the neural network;

decoding the weight parameters of the neural network using a context-dependent arithmetic coding;

selecting a context for a decoding of a weight parameter, or for a decoding of a syntax element of a number representation of the weight parameter, in dependence on one or more previously decoded weight parameters and/or in dependence on one or more previously decoded syntax elements of a number representation of one or more weight parameters;

wherein the weight parameter, or a syntax element of the weight parameter, is decoded using the selected context; and selecting the context for a decoding of a zero flag of the weight parameter in dependence whether a weight parameter preceding the currently decoded weight parameter has already been decoded and/or is available.

15. A non-transitory computer readable medium storing a computer program indicating instructions that, when executed by at least one processor of a computing device, cause the computing device to perform a method for decoding weight parameters of a neural network, wherein the method comprises operations:

acquiring a plurality of bits representing weight parameters of the neural network;

decoding the weight parameters of the neural network using a context-dependent arithmetic coding;

selecting a context for a decoding of a weight parameter, or for a decoding of a syntax element of a number representation of the weight parameter, in dependence on one or more previously decoded weight parameters and/or in dependence on one or more previously decoded syntax elements of a number representation of one or more weight parameters;

wherein the weight parameter, or a syntax element of the weight parameter, is decoded using the selected context; and selecting the context for a decoding of a zero flag of the weight parameter in dependence whether a weight parameter preceding the currently decoded weight parameter has already been decoded and/or is available.

16. An encoder for encoding weight parameters of a neural network, the encoder comprising:

a communication interface;

a memory storing instructions; and a processor which is coupled to the communication interface and the memory, to execute the instructions stored in the memory to implement operations comprising:

obtaining a plurality of weight parameters of the neural network;

encoding the weight parameters of the neural network using a context-dependent arithmetic coding;

selecting a context for an encoding of a weight parameter, or for an encoding of a syntax element of a number representation of the weight parameter, in dependence on one or more previously encoded weight parameters and/or in dependence on one or more previously encoded syntax elements of a number representation of one or more weight parameters;

encoding the weight parameter, or a syntax element of the weight parameter, using the selected context; and selecting the context for an encoding of a zero flag of the weight parameter in dependence whether a weight parameter preceding the currently encoded weight parameter has already been encoded and/or is available.

17. A non-transitory computer-readable medium for storing data associated with a data stream, wherein the data stream comprising weight parameters of the neural network is encoded thereinto using an encoder according to claim 16.

* * * * *